United States Patent [19]
Morii

[11] Patent Number: 5,847,411
[45] Date of Patent: Dec. 8, 1998

[54] SEMICONDUCTOR DEVICE HAVING A CHANNEL REGION INCLUDING A VACANCY-INTRODUCED POLYSILICON LAYER

[75] Inventor: Tomoyuki Morii, Osaka, Japan

[73] Assignee: Matsushita Electric Industrial Co., Ltd., Osaka, Japan

[21] Appl. No.: 827,761

[22] Filed: Apr. 10, 1997

[30] Foreign Application Priority Data

Apr. 11, 1996 [JP] Japan .................................. 8-089234
Apr. 15, 1996 [JP] Japan .................................. 8-092353

[51] Int. Cl.⁶ .......................... H01L 29/04; H01L 31/036
[52] U.S. Cl. ........................ 257/64; 257/66; 257/335; 257/617
[58] Field of Search ................... 257/64, 65, 66, 257/74, 75, 221, 285, 315, 317, 335, 3, 617

[56] References Cited

U.S. PATENT DOCUMENTS

| | | | |
|---|---|---|---|
| 5,481,128 | 1/1996 | Hong | 257/320 |
| 5,548,132 | 8/1996 | Batra et al. | 257/66 |
| 5,583,366 | 12/1996 | Nakazawa | 257/40 |
| 5,665,981 | 9/1997 | Banerjee et al. | 257/66 |

FOREIGN PATENT DOCUMENTS 7-235614  9/1995  Japan .

*Primary Examiner*—Valencia Martin-Wallace
*Assistant Examiner*—George C. Eckert, II
*Attorney, Agent, or Firm*—McDermott, Will & Emery

[57] ABSTRACT

A first polysilicon layer is formed on a substrate, and vacancies are introduced into an upper portion of the first polysilicon layer, thereby forming a second polysilicon layer. Then, a third polysilicon layer is formed on the second polysilicon layer. After depositing a silicon oxide film and a polysilicon film for a gate on the third polysilicon layer, these films are made into a pattern, thereby forming a control gate electrode and a gate oxide film. Impurity ions are then implanted, thereby forming source/drain regions. Thus, a channel region including the second polysilicon layer with the vacancies introduced is disposed below the control gate electrode, and hence, the mobility of a carrier in the channel region can be improved. As a result, a device can be operated at a high speed with a low voltage.

23 Claims, 21 Drawing Sheets

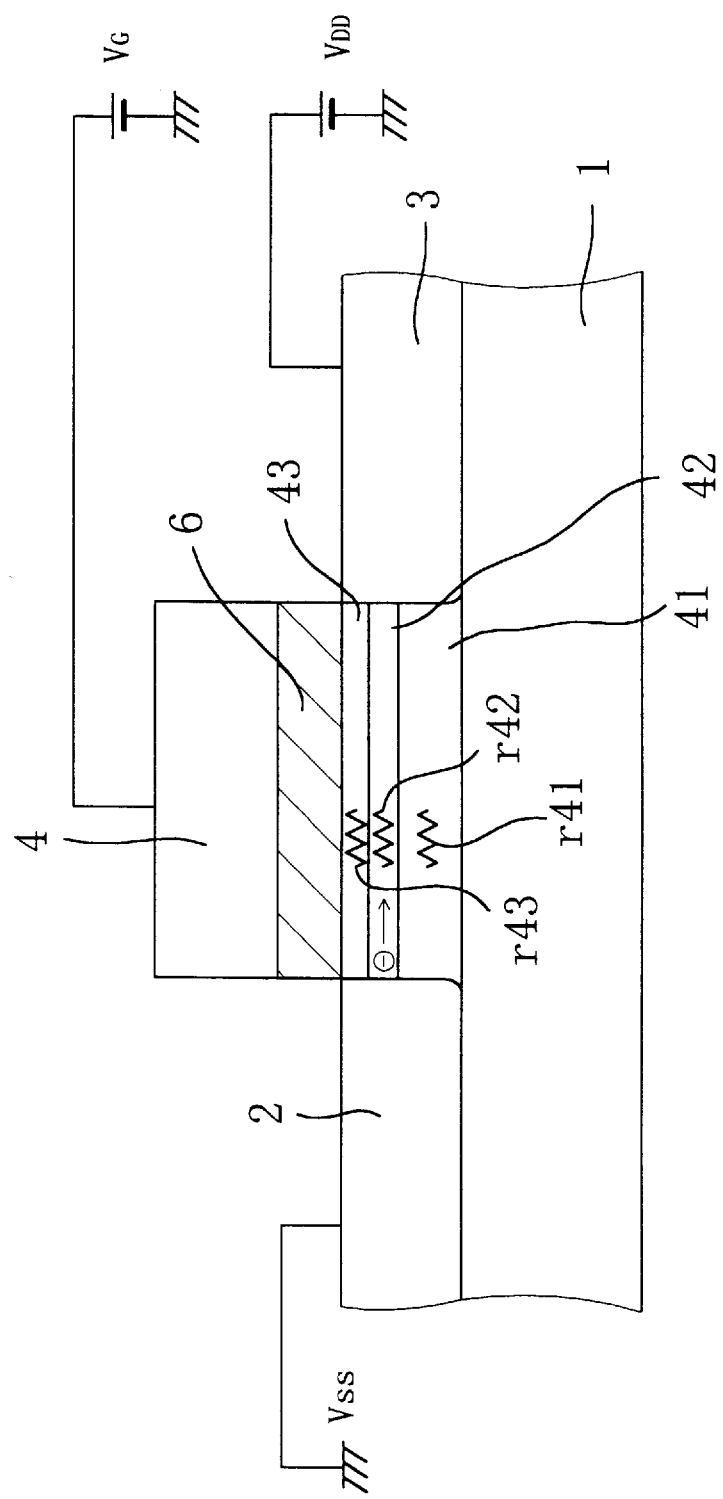

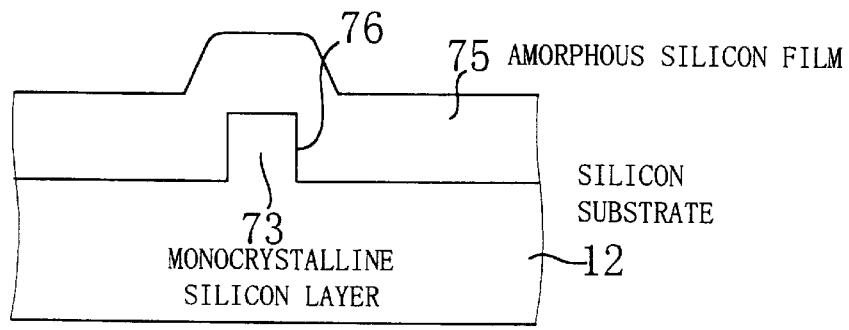
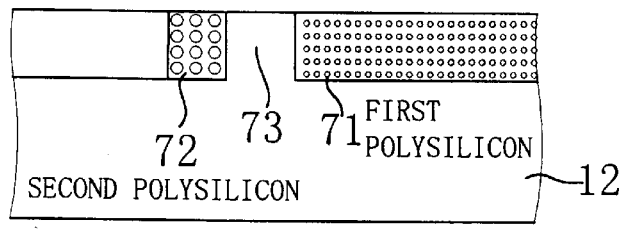
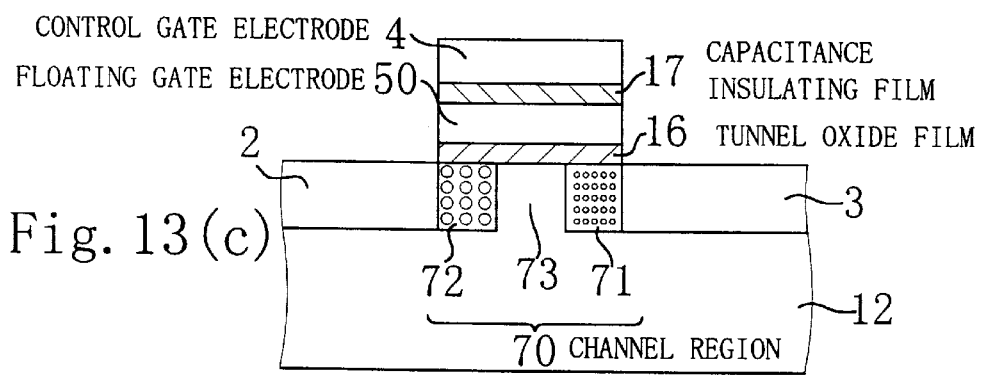
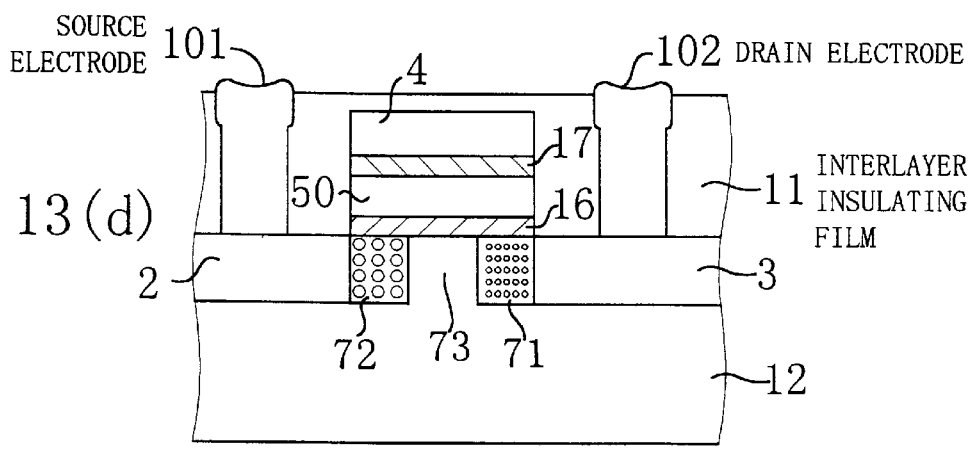

SEMICONDUCTOR DEVICE HAVING A CHANNEL REGION INCLUDING A VACANCY-INTRODUCED POLYSILICON LAYER

BACKGROUND OF THE INVENTION

The present invention relates to improvement of a field effect transistor and a semiconductor storage device having a polysilicon layer in a channel region or a charge storage region.

A known field effect transistor includes an active area such as source/drain regions and a channel region of amorphous silicon or polysilicon formed on an insulating substrate such as a glass substrate. In particular, a thin film transistor (TFT) used in an active-matrix liquid crystal display and the like adopts such a structure, so that highly integrated field effect transistors can be inexpensively manufactured.

FIG. 22 is a sectional view for showing the structure of a conventional TFT. As is shown in FIG. 22, a polysilicon film is formed on a substrate 1 of an insulating material such as glass, and a gate oxide film 6 and a control gate electrode 4 are formed on the polysilicon film. At both sides of the control gate electrode 4 in the polysilicon film, a source region 2 and a drain region 3 both of a polysilicon film including an n-type impurity at a high concentration are formed. In an area between the source region 2 and the drain region 3, namely, an area below the control gate electrode 4, a channel region of a polysilicon film including a p-type impurity is formed.

The source region 2, the drain region 3 and the channel region 8 are thus formed out of the polysilicon films, so that a field effect transistor for controlling an operation of a liquid crystal display panel can be formed on the transparent glass substrate or the like.

FIG. 23 is a sectional view for showing the structure of a conventional general nonvolatile semiconductor storage device. As is shown in FIG. 23, the conventional nonvolatile semiconductor storage device comprises a channel region 8 including a p-type impurity formed in a silicon substrate 12, an n-type source region 2 and an n-type drain region 3 formed in the silicon substrate 12 so as to oppose each other with the channel region 8 sandwiched therebetween, a tunnel oxide film 16 formed on the channel region 8, a floating gate electrode 50 of a polysilicon film formed on the tunnel oxide film 16, a capacitance insulating film 17 formed on the floating gate electrode 50, a control gate electrode 4 of a polysilicon film or the like formed on the capacitance insulating film 17, an interlayer insulating film 11 of a silicon oxide film deposited on the source region 2, the drain region 3 and the control gate electrode 4, and a source electrode 101 and a drain electrode 102 in contact with the source region 2 and the drain region 3, respectively formed by burying contact holes formed in the interlayer insulating film 11.

In this semiconductor storage device, a charge is injected into the floating gate electrode 50 so as to attain a charge-stored state or a charge is extracted from the floating gate electrode 50 so as to attain a charge-lost state. Thus, states where a current can easily flow and cannot easily flow in the source region 2 and the drain region 3 sandwiching the channel region 8 are obtained, thereby writing, erasing and reading information.

The conventional TFT shown in FIG. 22 has, however, the following problems:

First, particularly in a TFT used in an active-matrix display, the TFT is required to be improved in its operational speed as the number of pixels is increased, namely, as the degree of integration is increased. Although polysilicon can exhibit higher mobility than amorphous silicon, it is difficult to realize further higher mobility by using this conventional structure.

Secondly, the conventional structure of the field effect transistor cannot realize a multifunctional field effect transistor and is limited in applicable fields.

Also, the conventional nonvolatile semiconductor storage device of FIG. 23 has the following problems:

First, in charging the floating gate electrode, the polysilicon film can be degraded, for example, a defect can be caused in the polysilicon film. As a result, a charge storage amount can be varied, so that a read error can occur.

Secondly, the conventional structure of the semiconductor storage device is limited in improvement of its function, for example, in forming a multivalued memory by changing the amount of a charge stored in the floating gate electrode.

SUMMARY OF THE INVENTION

The first object of the invention is, in a field effect transistor including a channel region of polysilicon, improving an operational speed and decreasing an operational voltage by providing a polysilicon layer having high mobility of a carrier. In order to achieve the first object, the invention provides a first field effect transistor and a first method of manufacturing a field effect transistor.

The second object of the invention is realizing multifunction of a field effect transistor including a channel region of polysilicon by providing a plurality of polysilicon layers having different channel resistivities in the channel region. In order to achieve the second object, the invention provides a second field effect transistor and a second method of manufacturing a field effect transistor.

The third object of the invention is, in a semiconductor storage device including a floating gate of polysilicon, preventing a malfunction due to variation with time of a charge storage amount by providing means for preventing degradation of a polysilicon film in injecting a charge and the like. In order to achieve the third object, the invention provides a first semiconductor storage device and a first method of manufacturing a semiconductor storage device.

The fourth object of the invention is, in a semiconductor storage device including a channel region of polysilicon, realizing a multivalued memory function by providing a plurality of polysilicon layers having different channel resistivities in the channel region. In order to achieve the fourth object, the invention provides a second semiconductor storage device, a second method of manufacturing a semiconductor storage device and first and second methods of driving a semiconductor storage device.

The first field effect transistor of this invention comprises a substrate; a channel region formed on the substrate and including a vacancy-introduced polysilicon layer; a gate insulating film formed on the channel region; a gate electrode formed on the gate insulating film; and a pair of source/drain regions sandwiching the channel region.

In this field effect transistor, since each vacancy is evacuated, the introduction of the vacancies comes to the same thing as the channel length of the channel region being shortened. Accordingly, the field effect transistor, which includes the channel region of a polysilicon film, can achieve very high mobility of a carrier, namely, can attain a rapid operation at a low voltage.

In the first field effect transistor, the channel region can include a polysilicon layer without vacancies introduced formed at least on or below the polysilicon layer including a large number of vacancies per unit volume.

As a result, the channel region can be formed in an appropriate position, and the performance of the field effect transistor can be more optimized.

In the first field effect transistor, the substrate can be of an insulating material, and the source/drain regions can be formed out of a polysilicon film deposited on the substrate.

As a result, the field effect transistor can be used as a TFT applicable to a liquid crystal display and the like.

Alternatively, the substrate can be of a semiconductor material, and the source/drain regions can extend into the substrate and a polysilicon film deposited on the substrate.

The second field effect transistor of this invention comprises a substrate; a channel region formed on the substrate and including a plurality of polysilicon layers, which are disposed in series along a direction of a flow of a channel current and have different resistivities from one another; a gate insulating film formed on the channel region; a gate electrode formed on the gate insulating film; and a pair of source/drain regions sandwiching the channel region.

This field effect transistor attains a characteristic that a drain current is discontinuously increased, while increasing a voltage at the drain region on the basis of the source region, at a voltage where the tip of a depletion layer extending from the drain region passes a boundary between the polysilicon layers. As a result, the field effect transistor has particular functions such as a non-linear characteristic.

In the second field effect transistor, the resistivities of the polysilicon layers can be adjusted to be different from one another by using a difference in an average size of crystalline grains among the polysilicon layers.

As a result, the aforementioned effect can be definitely attained because the resistivity is smaller as the average size of the crystalline grains in the polysilicon layer is larger.

In this case, among the polysilicon layers, one closer to the drain region preferably includes crystalline grains with a smaller average size.

Alternatively, each of the polysilicon layers can be formed out of a vacancy-introduced polysilicon layer, and the resistivities of the polysilicon layers can be adjusted to be different from one another by using a difference in a number of vacancies per unit volume among the polysilicon layers.

As a result, the aforementioned effect can be definitely attained because the resistivity is smaller as a larger number of vacancies are introduced into the polysilicon layer.

In this case, among the polysilicon layers, one closer to the drain region preferably includes a smaller number of vacancies per unit volume.

Alternatively, the resistivities of the polysilicon layers can be adjusted to be different from one another by allowing a polysilicon layer with vacancies introduced and a polysilicon layer without vacancies introduced to be included in the polysilicon layers.

In the second field effect transistor, the substrate can be of an insulating material, and the source/drain regions can be formed out of a polysilicon film deposited on the substrate.

In this case, the field effect transistor, serving as a TFT, can attain particular functions such as a non-linear characteristic.

Alternatively, the substrate can be of a semiconductor material, and the source/drain regions can extend into the substrate and a polysilicon film deposited on the substrate.

The first semiconductor storage device of this invention comprises a substrate having a semiconductor area; a channel region formed in a part of the semiconductor area; a tunnel insulating film formed on the channel region and allowing a charge to pass therethrough by tunneling; a floating gate electrode formed on the tunnel insulating film and including a vacancy-introduced polysilicon layer; a capacitance insulating film formed in contact with at least a part of the floating gate electrode; a control gate electrode formed to be capable of capacitance coupling with the floating gate electrode through the capacitance insulating film; and a pair of source/drain regions formed in the semiconductor area and sandwiching the channel region.

In this semiconductor storage device, since the floating gate includes the vacancy-introduced polysilicon layer, when a charge is injected into the floating gate electrode, the charge is stored in the vacancies having a high ability to store a charge. Since the charge moves mainly through a vacancy level with a lower potential energy within the floating gate electrode, the polysilicon film in the floating gate electrode is less damaged. As a result, the variation with time of the charge storage amount due to the degradation of the polysilicon layer can be suppressed.

In the first semiconductor storage device, the floating gate electrode can further include a polysilicon layer without vacancies introduced at least on or below the vacancy-introduced polysilicon layer.

The second semiconductor storage device of this invention comprises a substrate having a semiconductor area; a channel region formed in a part of the semiconductor area and including a plurality of polysilicon layers, which are disposed in series along a direction of a flow of a channel current and have different resistivities from one another; a tunnel insulating film formed on the channel region and allowing a charge to pass therethrough by tunneling; a floating gate electrode formed on the tunnel insulating film; a capacitance insulating film formed in contact with at least a part of the floating gate electrode; a control gate electrode formed to be capable of capacitance coupling with the floating gate electrode through the capacitance insulating film; and a pair of source/drain regions formed in the semiconductor area and sandwiching the channel region.

This semiconductor storage device attains a characteristic that a drain current is discontinuously increased, while increasing a voltage at the drain region on the basis of the source region with a voltage at the control gate electrode retained constant, at a voltage where a tip of a depletion layer extending from the drain region reaches a boundary between the polysilicon layers.

Furthermore, when the voltage at the control gate electrode on the basis of the source region and the drain region is increased with the source region and the drain region set at the same potential, the voltage at the floating gate electrode is increased owing to capacitance coupling with the control gate electrode. Therefore, a charge can be injected from the source region and the region into the floating gate electrode. At this point, since the polysilicon layer adjacent to the source region has a different resistivity from the polysilicon layer adjacent to the drain region, the amount of a charge injected into the floating gate electrode can be controlled in accordance with the voltage at the control gate electrode.

Accordingly, due to these characteristics, this semiconductor storage device can be used as a multivalued memory by injecting different amounts of charge into the floating gate electrode.

The channel region can include two, polysilicon layers having different resistivities from each other and a monocrystalline silicon layer between the polysilicon layers.

In this case, since the monocrystalline silicon layer having a comparatively high resistivity is disposed at the center of the channel region, the amount of a charge injected into the floating gate electrode with the potential at the control gate electrode set higher than that at the source/drain regions can be more easily adjusted by utilizing the difference in the resistivity between the polysilicon layer adjacent to the source region and the polysilicon layer adjacent to the drain region.

For forming the plural polysilicon layers having the different resistivities in the channel region, the structures as described with regard to the second field effect transistor are applicable.

The first method of manufacturing a field effect transistor of this invention comprises the steps of forming a polysilicon film on a substrate; introducing vacancies into at least a part of the polysilicon film; forming a gate insulating film on the part of the polysilicon film where the vacancies are introduced; forming a gate electrode on the gate insulating film; and forming source/drain regions by introducing an impurity into areas in the polysilicon film at both sides of the gate electrode.

In this method, the gate insulating film and the gate electrode are formed on the area of the polysilicon film where the vacancies are introduced, and the area with the vacancies introduced is sandwiched between the source/drain regions. In other words, the area of the polysilicon film where the vacancies are introduced works as the channel region of the field effect transistor. Therefore, the structure for exhibiting the effects of the first field effect transistor can be easily realized.

In the first method of manufacturing a field effect transistor, the step of introducing the vacancies can include a step of replacing silicon in the polysilicon film with hydrogen by implanting hydrogen ions into the polysilicon film; and a step of releasing hydrogen from the polysilicon film by an annealing.

In this method, the vacancies can be easily introduced into the polysilicon film because a part of the polysilicon layer, where silicon is replaced with hydrogen and the hydrogen is released, remains as a vacancy.

The second method of manufacturing a field effect transistor of this invention comprises the steps of forming, on a substrate, a polysilicon film including a plurality of polysilicon layers which are disposed in series along a gate length and have different resistivities from one another; forming a gate insulating film extending over the polysilicon layers; forming a gate electrode on the gate insulating film; and forming source/drain regions by introducing an impurity into areas in the polysilicon film at both sides of the gate electrode.

In this method, the plural polysilicon layers having the different resistivities are disposed below the gate electrode in series along the gate length. Since the gate electrode is formed above the polysilicon layers and the polysilicon layers are sandwiched between the source/drain regions, the channel region including the plural polysilicon layers can be formed. Accordingly, the structure for exhibiting the effects of the second field effect transistor can be easily realized.

In the second method of manufacturing a field effect transistor, the step of forming the polysilicon film can include a step of forming an amorphous silicon film on the substrate; and a step of changing the amorphous silicon film into a polysilicon film by an annealing, and the polysilicon layers having the different resistivities from one another can be formed by forming a plurality of polysilicon layers including crystalline grains with different average sizes from one another, with conditions for annealing the amorphous silicon film locally changed.

An amorphous silicon film has an irregular structure formed by rapid solidification and is thermally unstable. Therefore, when the amorphous silicon film is annealed, a change to a stable crystalline state is caused. Accordingly, by locally changing the annealing condition, the plural polysilicon layers including crystalline grains with different average sizes can be easily formed out of a single amorphous silicon film.

Alternatively, the step of forming the polysilicon film can include a step of forming a polysilicon film on the substrate and replacing silicon in the polysilicon film with hydrogen by implanting hydrogen ions into the polysilicon film; and a step of releasing hydrogen from the polysilicon film by an annealing, and the polysilicon layers having the different resistivities from one another can be formed by forming a plurality of polysilicon layers including vacancies in different numbers per unit volume from one another, with a concentration of the implanted hydrogen ions locally changed.

By adopting this method, the plural polysilicon layers including vacancies in different numbers per unit volume can be formed in the polysilicon film. Owing to the presence of the evacuated vacancies, the polysilicon layers can attain lower resistivities than a polysilicon layer including no vacancies. At this point, since the resistivity of the polysilicon layer depends upon the number of the vacancies per unit volume, the plural polysilicon layers having the different resistivities can be easily formed.

The first method of manufacturing a semiconductor storage device of this invention comprises the steps of forming a tunnel insulating film on a semiconductor area in a substrate; forming a floating gate electrode including a vacancy-introduced polysilicon layer on the tunnel insulating film; forming a capacitance insulating film in contact with the floating gate electrode; forming a control gate electrode on the capacitance insulating film; and forming source/drain regions by introducing an impurity into areas in the semiconductor area at both sides of the floating gate electrode.

In this method, the floating gate electrode including a large number of vacancies can be formed, and hence, the resultant floating gate electrode has a large charge storage amount and is hardly degraded with time in the charge storage amount due to the degradation of the polysilicon layer in injecting a charge.

The second method of manufacturing a semiconductor storage device of this invention comprises the steps of forming, on a substrate, a polysilicon film including a plurality of polysilicon layers which are disposed in series along a gate length and have different resistivities from one another; forming a tunnel insulating film extending over the polysilicon layers; forming a floating gate electrode on the tunnel insulating film; forming a capacitance insulating film in contact with the floating gate electrode; forming a control gate electrode on the capacitance insulating film; and forming source/drain regions by introducing an impurity into areas in the polysilicon film at both sides of the floating gate electrode.

In this method, the channel region including the plural polysilicon layers having the different resistivities are formed below the tunnel insulating film of the semiconductor storage device. Accordingly, the resultant semiconductor storage device can variously change a charge injection amount into the floating gate electrode and the like by utilizing the difference in the resistivity. In other words, the structure for exhibiting the functions of the second semiconductor storage device can be easily realized.

In the second method of manufacturing a semiconductor storage device, the step of forming the polysilicon film can be carried out by forming at least two grooves on the substrate and filling the grooves with polysilicon layers with different resistivities from each other.

This method can easily realize the structure of the semiconductor storage device in which the monocrystalline silicon layer is formed at the center of the channel region and sandwiched between the polysilicon layers having different resistivities.

The plural polysilicon layers having the different resistivities from one another can be formed by any of the methods described with regard to the first and second methods of manufacturing a field effect transistor.

In the first method of driving a semiconductor storage device of this invention, which includes a substrate having a semiconductor area; a tunnel insulating film formed on the semiconductor area and allowing a charge to pass therethrough by tunneling; a floating gate electrode formed on the tunnel insulating film; a capacitance insulating film formed in contact with at least a part of the floating gate electrode; a control gate electrode formed to be capable of capacitance coupling with the floating gate electrode through the capacitance insulating film; a channel region formed in a part of the semiconductor area below the gate insulating film and including at least two polysilicon layers which are disposed in series in a direction of a flow of a channel current and have different resistivities from each other; and source/drain regions formed in the semiconductor area at both sides of the floating gate electrode, a plurality of information are stored in the floating gate electrode by applying, between the source/drain regions, a first voltage at which a depletion layer is formed in merely part of the polysilicon layers and a second voltage at which a depletion layer is formed in the part of the polysilicon layers and another polysilicon layer apart from the part of the polysilicon layers.

In this method, when an application voltage between the source/drain regions of the semiconductor storage device is changed, an increasing ratio of a current against the voltage is discontinuously changed when the range of the depletion layer reaches the boundary between the polysilicon layers. Accordingly, the storage amount of a charge injected into the floating gate electrode at the first voltage is remarkably different from the storage amount of a charge injected into the floating gate electrode at the second voltage. Therefore, in reading information, these two states of charge injection can be distinguished from each other on the basis of a current value flowing between the source/drain regions. Thus, the semiconductor storage device can be singly used as a multivalued memory.

In the second method of driving a semiconductor storage device of this invention, which includes a substrate having a semiconductor area; a tunnel insulating film formed on the semiconductor area and allowing a charge to pass therethrough by tunneling; a floating gate electrode formed on the tunnel insulating film; a capacitance insulating film formed in contact with at least a part of the floating gate electrode; a control gate electrode formed to be capable of capacitance coupling with the floating gate electrode through the capacitance insulating film; a channel region formed in a part of the semiconductor area below the gate insulating film and including at least two polysilicon layers, which are disposed in series in a direction of a flow of a channel current and have different resistivities from each other, and a monocrystalline silicon layer sandwiched between the at least two polysilicon layers; and source/drain regions formed in the semiconductor area at both sides of the floating gate electrode, at least two different information are stored in the floating gate electrode by applying, between the source/drain regions and the gate electrode, a first voltage at which merely one of the at least two polysilicon layers is inverted and a second voltage at which both of the at least two polysilicon layers are inverted.

In this method, when an application voltage between the source/drain regions and the control gate electrode of the semiconductor storage device is changed, an increasing ratio of a current against the voltage is discontinuously changed at the boundary between the state where one of the polysilicon layers alone is inverted and the state where both the polysilicon layers are inverted. Accordingly, the storage amount of a charge injected into the floating gate electrode at the first voltage is remarkably different from the storage amount of a charge injected into the floating gate electrode at the second voltage. Therefore, in reading information, the two states of the charge injection can be easily distinguished from each other on the basis of a current value flowing between the source/drain regions. Thus, the semiconductor storage device can be singly used as a multivalued memory.

BRIEF DESCRIPTION OF THE DRAWINGS

FIG. 2 is a sectional view for showing a method of driving the field effect transistor of the first embodiment;

FIGS. 13(a) through 13(d) are sectional views for showing manufacturing procedures for a nonvolatile semiconductor storage device, according to a fifth embodiment of the invention, including a channel region formed out of a monocrystalline silicon layer sandwiched between two polysilicon layers respectively including crystalline grains with different average sizes;

DETAILED DESCRIPTION OF THE INVENTION (Embodiment 1)

A field effect transistor according to a first embodiment of the invention will now be described with reference to FIGS. 1(a) through 1(d), 2, 3 and 4.

Figure 1A:
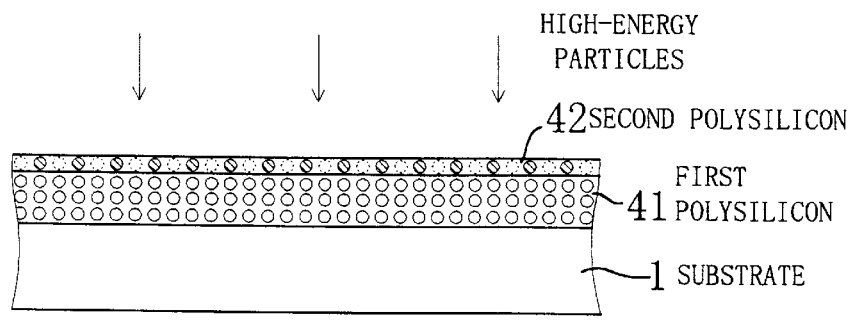
FIGS. 1(a) through 1(d) are sectional views for showing manufacturing procedures for a field effect transistor including a channel region with vacancies introduced according to a first embodiment of the invention.
Figure 1B:
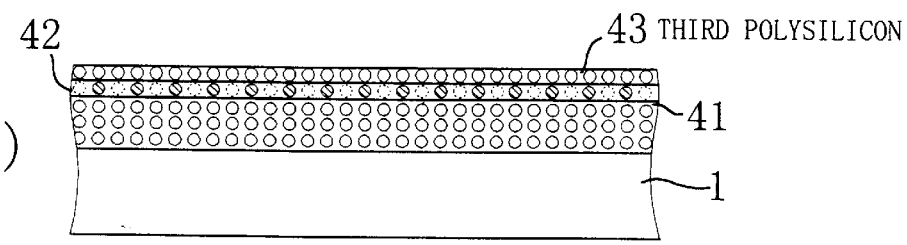
Figure 1C:
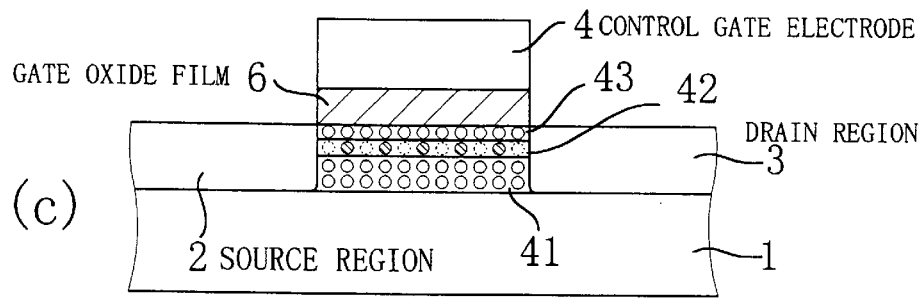
Figure 1D:
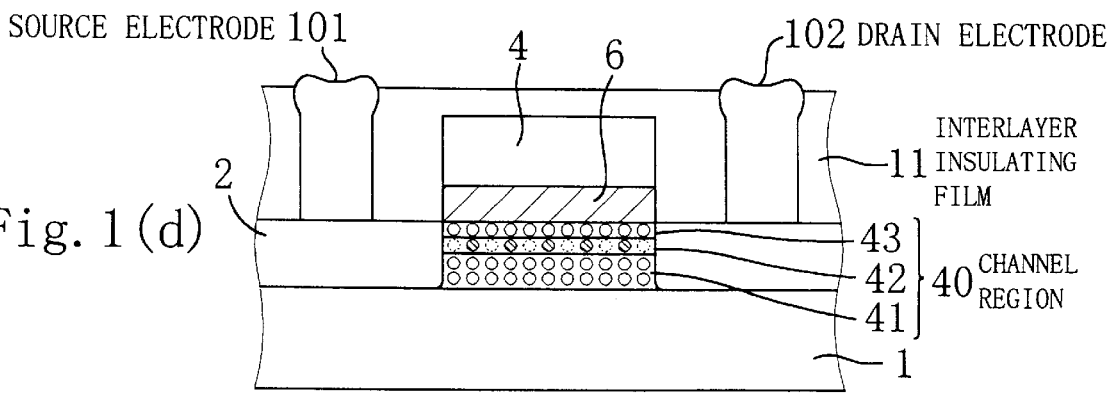

FIG. 1(d) is a sectional view for showing the structure of a polysilicon channel type field effect transistor manufactured by a method of this embodiment. The following description will be given on a field effect transistor manufactured by a process using a design rule (minimum dimension) of 0.25 μm through 10 μm.

As is shown in FIG. 1(d), the field effect transistor of this embodiment is formed on a substrate 1 of an insulating material such as glass and ceramic. The field effect transistor comprises a channel region 40 including three polysilicon layers formed on the substrate 1; a source region 2 and a drain region 3 opposing each other with the channel region 40 sandwiched therebetween on the substrate 1; a gate oxide film 6 of a silicon oxide film with a thickness of approximately 10 nm formed on the channel region 40; a control gate electrode 4 of a polysilicon film, a polycide film, an aluminum film or a tantalum film formed on the gate oxide film 6; an interlayer insulating film 11 of a silicon oxide film deposited on the source region 2, the drain region 3 and the control gate electrode 4; and a source electrode 101 and a drain electrode 102 in contact with the source region 2 and the drain region 3, respectively formed by burying contact holes formed in the interlayer insulating film 11.

A distance between the source region 2 and the drain region 3, i.e., a gate length, is 0.25 μm, and the source region 2 and the drain region 3 have a thickness of approximately 100 nm. Furthermore, the source region 2 and the drain region 3 are doped with an n-type impurity at a concentration of approximately $10^{20}$ through $10^{21}$ cm$^{-3}$.

The channel region 40 includes a first polysilicon layer 41 formed directly on the substrate 1, a second polysilicon layer 42 as a vacancy-introduced polysilicon layer formed on the first polysilicon layer 41, and a third polysilicon layer 43 formed on the second polysilicon layer 42. The entire channel region 40 has a thickness of approximately 100 nm similarly to the source region 2 and the like. Polysilicon included in the first and third polysilicon layers 41 and 43 has a grain size most easily controllable in a general manufacturing process. The second polysilicon layer 42 is formed by introducing vacancies into polysilicon having the same grain size as that in the first polysilicon layer 41, and the number of the vacancies in unit volume in the second polysilicon layer 42 is controlled so as not to cause an off-leakage. Furthermore, each of the polysilicon layers 41, 42 and 43 is doped with a p-type impurity at a concentration of approximately $10^{17}$ cm$^{-3}$.

Now, the manufacturing procedures for realizing the aforementioned structure of the field effect transistor will be described with reference to FIGS. 1(a) through 1(d).

First, in a procedure shown in FIG. 1(a), the first polysilicon layer 41 with a thickness of approximately 90 nm is deposited on the substrate 1 by the chemical vapor deposition (CVD). The first polysilicon layer 41 is then irradiated with high-energy particles from above, thereby changing an upper portion of the first polysilicon layer 41 into the second polysilicon layer 42, i.e., the vacancy-introduced polysilicon layer. The high-energy particles can be particles of silicon, ions of an inert gas such as argon, hydrogen ions, or the like. In this embodiment, hydrogen ions are implanted into the entire surface of the first polysilicon layer 41 at an accelerating energy of approximately 50 keV, and an annealing is effected at a temperature of approximately 500° C. Thus, the vacancies at a density in accordance with the implantation amount of the hydrogen ions can be formed in the upper portion of the first polysilicon layer 41. Specifically, silicon atoms in the polysilicon layer are replaced with hydrogen atoms through the implantation of the hydrogen ions, and the hydrogen atoms are released from the polysilicon layer through the subsequent annealing, resulting in forming the vacancies.

Next, in a procedure shown in FIG. 1(b), the third polysilicon layer 43 of a polysilicon film with a thickness of approximately 10 nm is formed on the second polysilicon layer 42.

Then, in a procedure shown in FIG. 1(c), a silicon oxide film is formed on the third polysilicon layer 43, and a polysilicon film for a gate is formed on the silicon oxide film by the CVD. Photolithography and etching are subsequently carried out, thereby patterning the polysilicon film for the gate and the silicon oxide film. As a result, the control gate electrode 4 and the gate oxide film 6 are formed. Then, arsenic ions at a high concentration are introduced, by using the control gate electrode 4 as a mask, into areas in the first through third polysilicon layers 41 through 43 at both sides of the control gate electrode 4, thereby forming the source region 2 and the drain region 3. In this manner, the channel region 40 including the three polysilicon layers 41 through 43 is formed below the gate electrode 4.

Subsequently, in a procedure shown in FIG. 1(d), the interlayer insulating film 11 of a silicon oxide film with a thickness of approximately 500 through 800 nm is deposited on the entire surface of the substrate, and the contact holes respectively reaching the source region 2 and the drain region 3 are formed in the interlayer insulating film 11. Then, a metal film is deposited within the contact holes and on the interlayer insulating film 11, and the metal film is made into a pattern, thereby forming the source electrode 101 and the drain electrode 102.

FIG. 2 is a sectional view for showing voltage application for driving the field effect transistor of this embodiment, wherein a potential at the control gate electrode 4 is set at 1 V, a potential at the drain region 3 (drain electrode 102) is set at 3 V, and the source region 2 (source electrode 101) is grounded (0 V). Assuming that the first, second and third polysilicon layers 41, 42 and 43 have resistivities r41, r42 and r43, respectively, the resistivity r42 of the second polysilicon layer 42 including a large number of vacancies is the smallest. Accordingly, when a potential is increased sufficiently for inverting the channel region 40 owing to capacitance coupling with the control gate electrode 4, a channel current flows in the second polysilicon layer 42 having the smallest resistivity.

Thus, the field effect transistor of this embodiment is provided with the second polysilicon layer 42 of the vacancy-introduced polysilicon film as a part of the channel region 40. Since each vacancy is evacuated, the introduction of the vacancies comes to substantially the same thing as the channel length being shortened by an area occupied by the vacancies. Accordingly, the mobility of a carrier in the second polysilicon layer 42 can be made extremely high. As a result, a larger channel current can be obtained than in a transistor including merely a polysilicon layer with a high resistivity.

Figure 3:
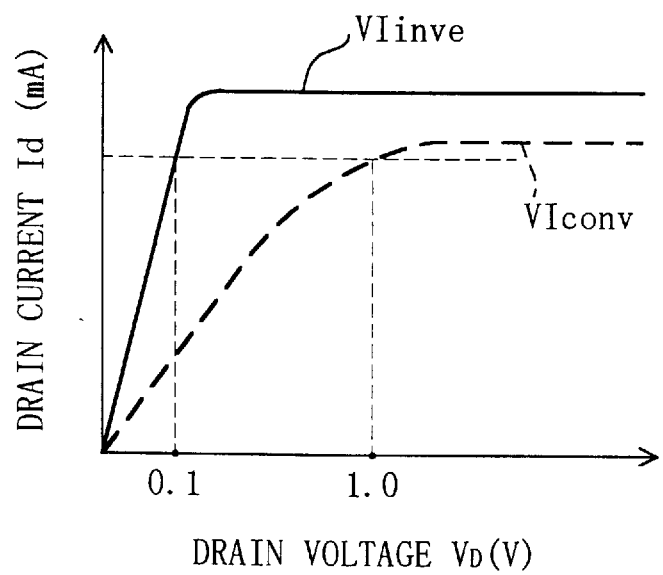
FIG. 3 is a diagram for showing comparison in a drain voltage-drain current characteristic between the field effect transistor of the first embodiment and a conventional field effect transistor.

FIG. 3 is a diagram for showing comparison in a Vd-Id characteristic between the field effect transistor of this embodiment and a conventional field effect transistor, wherein the abscissa indicates the drain voltage Vd and the ordinate indicates the drain current Id. The Vd-Id characteristic of the present field effect transistor is shown with a solid curve VIinve, and that of the conventional field effect transistor is shown with a broken curve VIconv. As is apparent from comparison between the curves VIinve and VIconv, the field effect transistor of this embodiment can obtain a larger drain current at a lower drain voltage. For example, a current value obtained at a voltage of 1 V in the conventional field effect transistor can be obtained at a voltage of 0.1 V in the present field effect transistor.

The saturation value of the drain current can be changed by adjusting the concentration of the impurity and the like. Furthermore, the second. polysilicon layer 42 including a large number of vacancies is sandwiched between the first and third polysilicon layers 41 and 43 including few vacancies in this field effect transistor, a current is difficult to flow in the vertical direction, and flows merely in the lateral direction along the second polysilicon layer 42.

The vacancies included in a polysilicon layer do not affect the lattice vibration of the entire polysilicon layer including a portion with the vacancies and a portion without vacancies. Therefore, there is no fear of a damage of the polysilicon layer by an applied voltage.

The hydrogen ions are implanted into the entire surface of the first polysilicon layer 41 in this embodiment, but the hydrogen ions can be locally implanted by using a focused ion beam apparatus.

Figure 4:
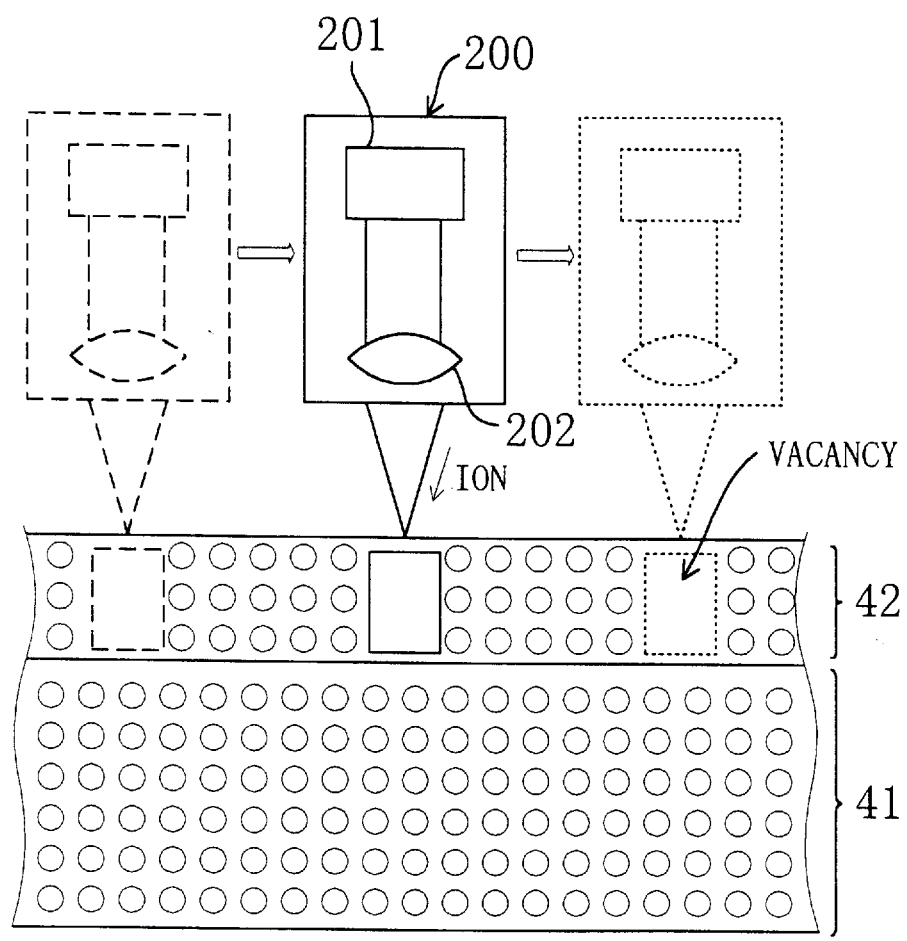
FIG. 4 is a sectional view for showing a method of introducing vacancies into a polysilicon layer by a focused ion beam method adoptable in the first embodiment.

FIG. 4 shows a method of forming the second polysilicon layer 42 by using the focused ion beam apparatus. As is shown in FIG. 4, ions generated by an ion source 201 are focused with a lens 202 into an ion beam with a diameter of approximately 10 nm for irradiation of the first polysilicon layer 41. Through this irradiation, Si atoms in the first polysilicon layer 41 are knocked on, thereby forming massive vacancies. For example, when the hydrogen ions are implanted at an implantation amount of approximately $10^{16}$ $cm^{-3}$ at an accelerating energy of approximately 50 keV, and an annealing is effected at a temperature of approximately 500° C., 10 through 20 vacancies each with a diameter of approximately 10 nm can be formed per length of 0.25 $\mu$m (along the gate). As a result, the vacancies occupy approximately a half of the dimension, corresponding to the channel length, of the second polysilicon layer 42. Since each vacancy is evacuated, the presence of the vacancies comes to substantially the same thing as the channel length being approximately halved. The diameter of the ion beam can be changed in a wide range. However, when the focused ion beam apparatus is used, it is not always necessary to form a vacancy with a size according to the diameter of the ion beam, but the ion beam can be focused merely for the purpose of increasing the density of the implanted ions.

Furthermore, the method of forming the vacancies in the polysilicon layer is not limited to the aforementioned method using the irradiation of the hydrogen ions. For example, by using a focused ion beam of Si ions with a diameter of approximately 10 nm, the Si ions are implanted into the polysilicon layer at an implantation amount of approximately $10^{15}$ $cm^{-3}$ at an accelerating energy of approximately 200 keV, and a thermal annealing (RTA) is effected for approximately 10 seconds at a temperature of approximately 500° C. Thus, vacancies at a density of $10^{10}$ $cm^{-2}$ can be formed in the polysilicon layer.

Alternatively, the following procedures can be adopted to form the vacancies: First, a silicon oxide film is formed on a silicon substrate A by thermal oxidation, and H$^+$ ions are implanted into the silicon substrate A at an implantation amount of approximately $2\times10^{16}$ through $1\times10^{17}$ $cm^{-2}$. Then, another substrate B having a polysilicon film on its top surface is adhered to the silicon substrate A with a silicon oxide film sandwiched therebetween. The adhesion is carried out by using an interatomic bond after washing the two surfaces to be adhered to each other. Then, an annealing is effected at a temperature of 400° through 600° C., and this annealing separates the silicon substrate A into two portions. As a result, the substrate B, the silicon oxide film and a thin monocrystalline silicon layer separated from the silicon substrate A are integrated. This means that the thin monocrystalline silicon layer is formed on the silicon oxide film on the substrate B. The resultant is annealed at a temperature of 1000° C. or more. Thus, the silicon oxide film and a residual silicon layer thereon forms a polysilicon layer including vacancies. In this manner, the vacancy-introduced polysilicon layer can be formed on the ordinary polysilicon layer on the substrate B.

(Embodiment 2)

A nonvolatile semiconductor storage device according to a second embodiment will now be described with reference to FIGS. 5(a) through 5(d) and 6.

Figure 5:
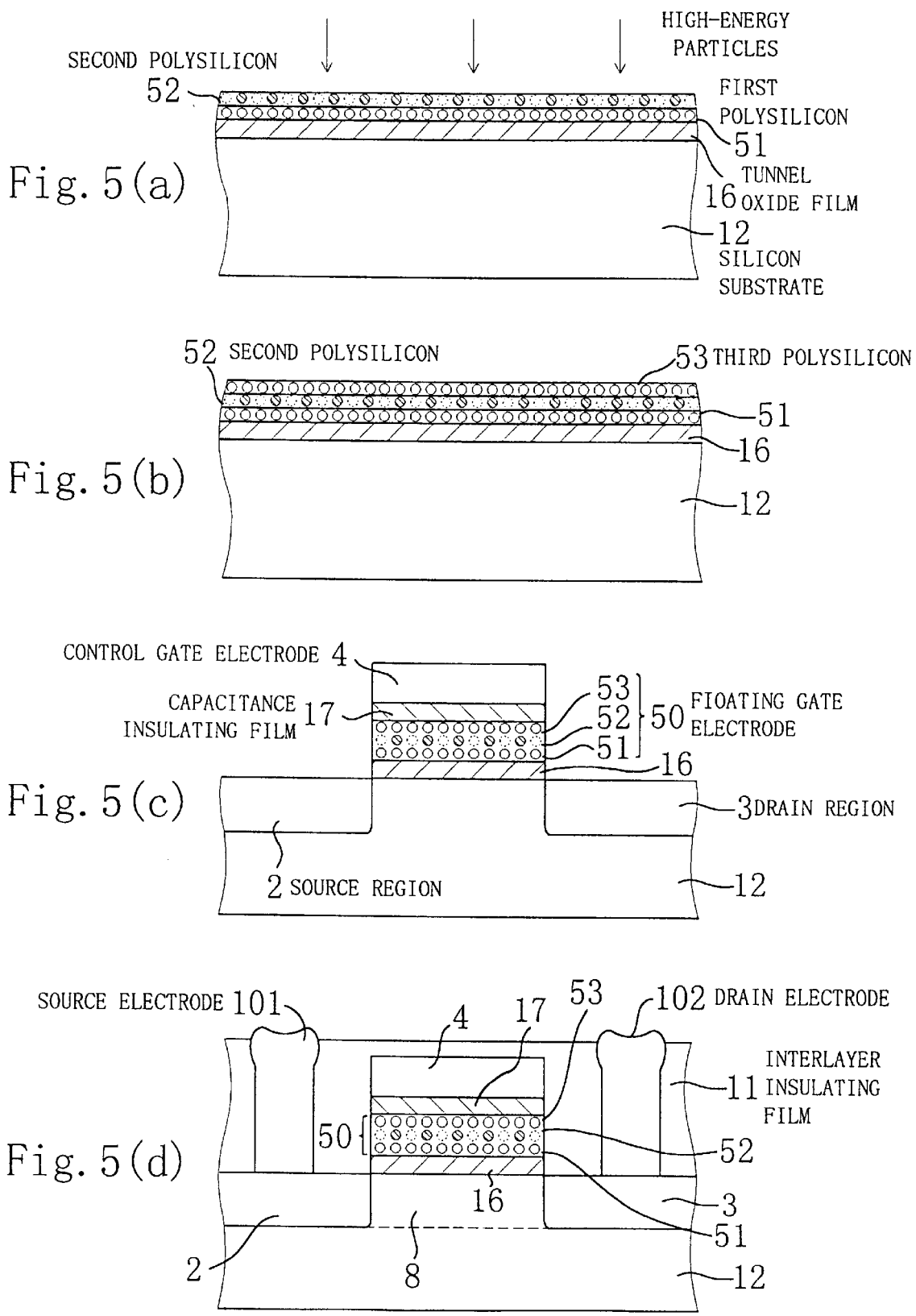
FIGS. 5(a) through 5(d) are sectional views for showing manufacturing procedures for a nonvolatile semiconductor storage device including a floating gate electrode with vacancies introduced according to a second embodiment of the invention.

FIG. 5(d) is a sectional view for showing the structure of a polysilicon floating gate type nonvolatile semiconductor storage device manufactured by a method of this embodiment. The following description will be give on a nonvolatile semiconductor storage device manufactured by a process using a design rule (minimum dimension) of 0.25 μm through 10 μm.

As is shown in FIG. 5(d), the nonvolatile semiconductor. storage device of this embodiment comprises a silicon substrate 12; a tunnel oxide film 16 of a silicon oxide film with a thickness of approximately 6 nm formed on the silicon substrate 12; a floating gate electrode 50 including three polysilicon layers formed on the tunnel oxide film 16; a source region 2 and a drain region 3 formed in the silicon substrate 12 at both sides of the floating gate electrode 50; a channel region 8 formed below the tunnel oxide film 16; a capacitance insulating film 17 of an ON (oxide-nitride) film with a thickness of approximately 15 nm including a silicon oxide film and a silicon nitride film formed on the floating gate electrode 50; a control gate electrode 4 of a polysilicon film, a polycide film, an aluminum film or a tantalum film formed on the capacitance insulating film 17; an interlayer insulating film 11 of a silicon oxide film deposited on the source region 2, the drain region 3 and the control gate electrode 4; and a source electrode 101 and a drain electrode 102 in contact with the source region 2 and the drain region 3, respectively formed by burying contact holes formed in the interlayer insulating film 11.

The control gate electrode 4 has a gate length (a length along the channel length) of 0.25 μm and a gate width (a length perpendicular to the channel length) of 2 μm. The source region 2 and the drain region 3 are both doped with an n-type impurity at a concentration of $10^{20}$ through $10^{21}$ cm$^{-3}$.

The floating gate electrode 50 includes a first polysilicon layer 51 formed directly on the silicon substrate 12, a second polysilicon layer 52 as a vacancy-introduced polysilicon layer formed on the first polysilicon layer 51 and a third polysilicon layer 53 formed on the second polysilicon layer 52, and has a thickness of approximately 100 nm as a whole. Polysilicon included in the first and third polysilicon layers 51 and 53 has a grain size most controllable in a general manufacturing process. The second polysilicon layer 52 is formed by introducing vacancies into polysilicon having the same grain size as that in the first polysilicon layer 51, and the number of the vacancies per unit volume in the second polysilicon layer 52 is controlled so as not to cause an off-leakage. Each of the polysilicon layers 51, 52 and 53 is doped with a p-type impurity at a concentration of approximately $10^{17}$ cm$^{-3}$.

Now, the manufacturing procedures for realizing the aforementioned structure of the nonvolatile semiconductor storage device will be described with reference to FIGS. 5(a) through 5(d).

First, in a procedure shown in FIG. 5(a), the thin tunnel oxide film 16 with a thickness of approximately 6 nm is formed on the silicon substrate 12 by thermal oxidation, and the first polysilicon layer 51 with a thickness of approximately 250 nm is deposited on the tunnel oxide film 16 by the CVD. Then, the first polysilicon layer 51 is irradiated with high-energy particles from above, thereby changing a portion of the first polysilicon layer 51 excluding a lower portion thereof into the second polysilicon layer 52, i.e., the vacancy-introduced polysilicon layer. This procedure is fundamentally the same as the corresponding procedure described in the first embodiment, but the proportion of the area including the vacancies is made larger, namely, the thickness of the second polysilicon layer 52 is increased, by increasing the irradiation energy for the high-energy particles in this embodiment.

Next, in a procedure shown in FIG. 5(b), the third polysilicon layer 53 of a polysilicon film with a thickness of approximately 50 nm is formed on the second polysilicon layer 52.

Then, in a procedure shown in FIG. 5(c), a silicon oxide film with a thickness of approximately 7 nm and a silicon nitride film with a thickness of approximately 8 nm are successively formed on the third polysilicon layer 53, thereby forming the ON film. Then, a polysilicon film with a thickness of approximately 200 nm is further formed on the ON film by the CVD. Photolithography and etching are then carried out, thereby patterning the uppermost polysilicon film, the ON film, the first through third polysilicon layers 51 through 53 and the tunnel insulating film 16. As a result, the control gate electrode 4 of the polysilicon film, the capacitance insulating film 17 of the ON film, the floating gate electrode 50 including the first through third polysilicon layers and the tunnel oxide film 16 are successively formed. Then, arsenic ions at a high concentration are introduced into the silicon substrate 12 at both sides of the floating gate electrode 50 by using the control gate electrode 4 and the like as a mask, thereby forming the source region 2 and the drain region 3. In this manner, the control gate electrode 4, the capacitance insulating film 17, the floating gate electrode 50 and the tunnel oxide film 16 cover the channel region 8 in the silicon substrate 12.

Next, in a procedure shown in FIG. 5(d), the interlayer insulating film 11 of a silicon oxide film with a thickness of 800 through 1000 nm is deposited on the entire surface of the substrate, and the contact holes respectively reaching the source region 2 and the drain region 3 are formed in the interlayer insulating film 11. A metal film is further deposited within the contact holes and on the interlayer insulating film 11, and the metal film is made into a pattern, thereby forming the source electrode 101 and the drain electrode 102.

Figure 6:
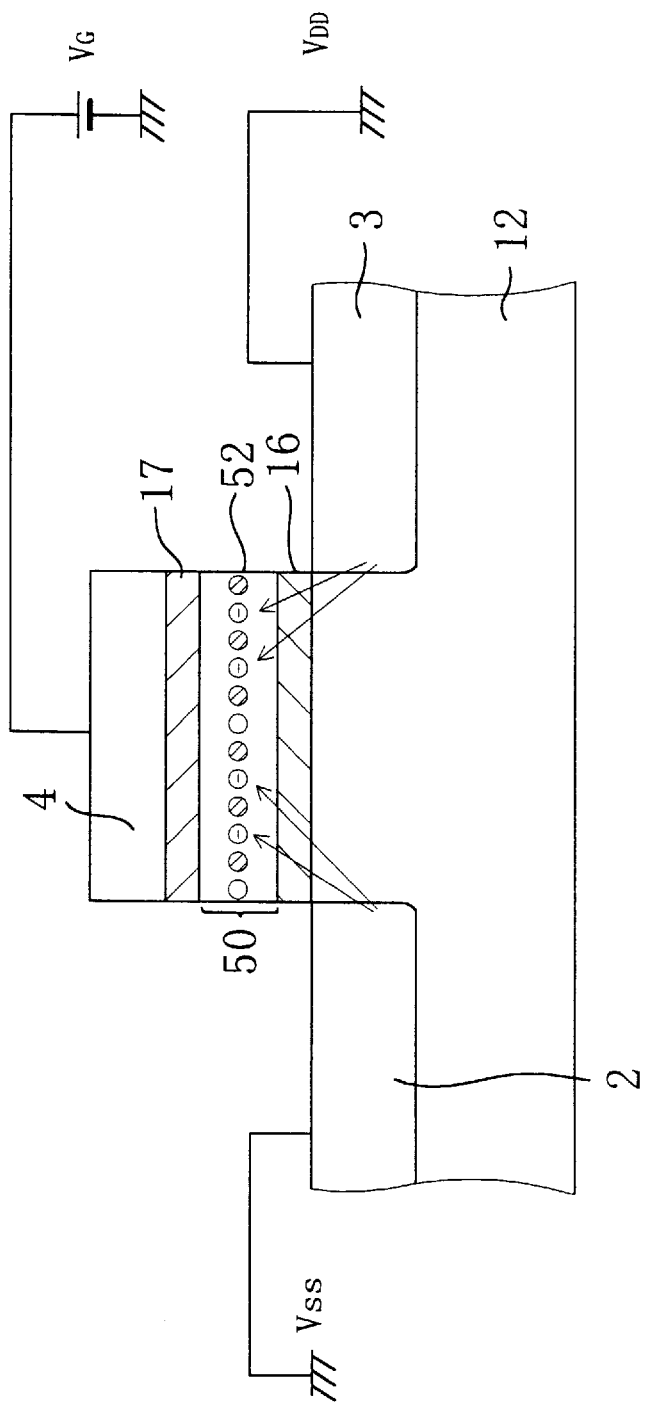
FIG. 6 is a sectional view for showing a method of driving the nonvolatile semiconductor storage device of the second embodiment.

FIG. 6 is a sectional view for showing voltage application for driving the nonvolatile semiconductor storage device of this embodiment, wherein a potential VG at the control gate electrode 4 is set at 2 V, and the drain region 3 (drain electrode 102) and the source region 2 (source electrode 101) are grounded (0 V). In this case, the potential at the control gate electrode 4 on the basis of the source region 2 and the drain region 3 is increased to 2 V. Accordingly, the potential of the floating gate electrode 50 is increased sufficiently to invert the source and drain regions 2 and 3 to capture a charge (electrons) from the source region 2 and the drain region 3 owing to the capacitance coupling with the control gate electrode 4, and the charge is captured in the second polysilicon layer 52 including a largest number of vacancies, i.e., charge capturing layers.

In this manner, the nonvolatile semiconductor storage device of this embodiment is provided with the second polysilicon layer 52 including a large number of vacancies in the floating gate electrode 50. Therefore, in capturing a charge by the floating gate electrode 50, the second polysilicon layer 52 including the largest number of vacancies captures the charge. As a result, the floating gate electrode is prevented from degrading in capturing a charge unlike in the conventional nonvolatile semiconductor storage device. Specifically, the second polysilicon layer 52 including a large number of vacancies is intentionally formed in the floating gate electrode 50, so as to collect areas for capturing the charge within the second polysilicon layer 52. Thus, the degradation of the floating gate electrode 50 can be avoided.

The second polysilicon layer 52 including a large number of vacancies is sandwiched between the first and third polysilicon layers 51 and 53 including few vacancies in this embodiment, which does not limit the invention as described in detail below.

(Embodiment 3)

A third embodiment of the invention will now be described with reference to FIGS. 7(a) through 7(c), 8(a) through 8(c) and 9.

Figure 7A:
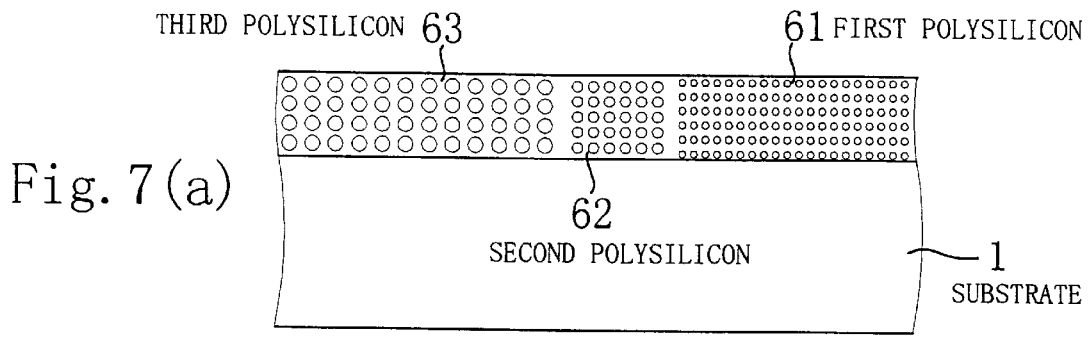
FIGS. 7(a) through 7(c) are sectional views for showing manufacturing procedures for a field effect transistor, according to a third embodiment of the invention, comprising a channel region formed out of a plurality of polysilicon layers respectively including crystalline grains with different average sizes.
Figure 7B:
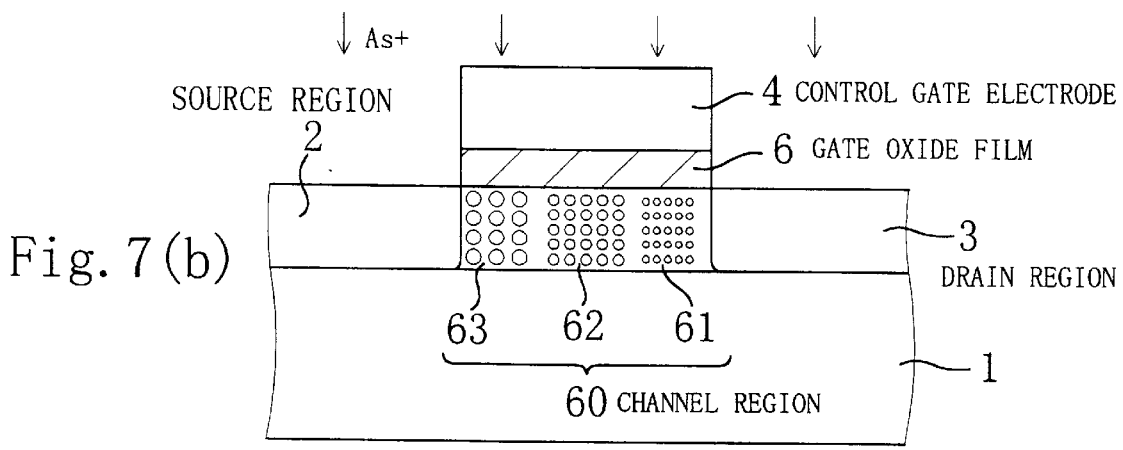
Figure 7C:
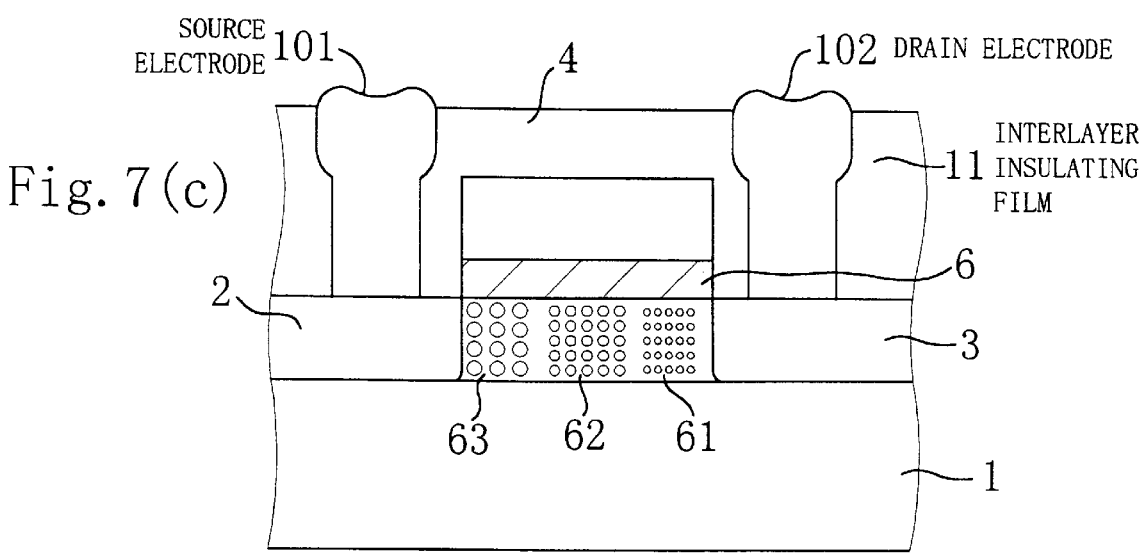

FIG. 7(c) is a sectional view for showing the structure of a polysilicon channel type field effect transistor manufactured by a method of this embodiment. The following description will be given on a field effect transistor manufactured by a process using a design rule (minimum dimension) of 0.25 μm through 10 μm.

As is shown in FIG. 7(c), the field effect transistor of this embodiment is formed on an upper surface of a substrate 1 of an insulating material such as glass and ceramic. The field effect transistor comprises a channel region 60 including three polysilicon layers formed on the substrate 1; a source region 2 and a drain region 3 opposing each other with the channel region 60 sandwiched therebetween on the substrate 1; a gate oxide film 6 of a silicon oxide film with a thickness of approximately 10 nm formed on the channel region 60; a control gate electrode 4 of a polysilicon film, a polycide film, an aluminum film or a tantalum film formed on the gate oxide film 6; an interlayer insulating film 11 of a silicon oxide film deposited on the source region 2, the drain region 3 and the control gate electrode 4; and a source electrode 101 and a drain electrode 102 in contact with the source region 2 and the drain region 3, respectively formed by burying contact holes formed in the interlayer insulating film 11.

A distance between the source region 2 and the drain region 3, i.e., a gate length, is 0.25 through 10 μm, and the source region 2 and the drain region 3 have a thickness of approximately 100 nm. Furthermore, the source region 2 and the drain region 3 are both doped with an n-type impurity at a concentration of $10^{20}$ through $10^{21}$ cm$^{-3}$.

The channel region 60 includes a first polysilicon layer 61 formed adjacent to the drain region 3 and including crystalline grains with a smallest average size, a second polysilicon layer 62 formed adjacent to the first polysilicon layer 61 and including crystalline grains with a larger average size than that in the first polysilicon layer 61, and a third polysilicon layer 63 formed between the second polysilicon layer 62 and the source region 2 and including crystalline grains with a further larger average size than that in the second polysilicon layer 62. In other words, the polysilicon layer closer to the drain region 3 includes crystalline grains with a smaller average size. The thickness of each of the polysilicon layers 61 through 63 is approximately 100 nm similarly to the source region 2 and the like. Furthermore, each of the polysilicon layers 61, 62 and 63 is doped with a p-type impurity at a concentration of approximately $10^{17}$ cm$^{-3}$.

Now, the manufacturing procedures for realizing the aforementioned structure of the field effect transistor will be described with reference to FIGS. 7(a) through 7(c).

First, in a procedure shown in FIG. 7(a), after forming an amorphous silicon film on the substrate 1 of glass or the like by the CVD, the amorphous silicon film is annealed under locally different conditions. Thus, the first and third polysilicon layers 61 and 63 with a larger width and the second polysilicon layer 62 with a smaller width sandwiched between the first and third polysilicon layers a 61 and 63 are formed. The annealing under the locally different conditions can be carried out by any of various methods described below. Alternatively, by locally changing the state of the underlying substrate, the plural polysilicon layers respectively including crystalline grains with different average sizes can be formed.

Next, in a procedure shown in FIG. 7(b), a silicon oxide film is formed on the polysilicon layers 61 through 63, and a polysilicon film for a gate is formed on the silicon oxide film by the CVD. Then, photolithography and etching are carried out, thereby patterning the polysilicon film for the gate and the silicon oxide film. Thus, the control gate electrode 4 and the gate oxide film 6 are formed so as to cover the first through third polysilicon layers 61 through 63. By using the control gate electrode 4 as a mask, arsenic ions at a high concentration are introduced into areas in the first and third polysilicon layers 61 and 63 at both sides of the control gate electrode 4, thereby forming the source region 2 and the drain region 3. In this manner, the channel region 60 including the three polysilicon layers 61 through 63 are formed below the control gate electrode 4.

Then, in a procedure shown in FIG. 7(c), the interlayer insulating film 11 of a silicon oxide film with a thickness of approximately 500 through 800 nm is deposited on the entire surface of the substrate, and the contact holes respectively reaching the source region 2 and the drain region 3 are formed in the interlayer insulating film 11. A metal film is then deposited within the contact holes and on the interlayer insulating film 11, and the metal film is made into a pattern, thereby forming the source electrode 101 and the drain electrode 102.

Figure 8A:
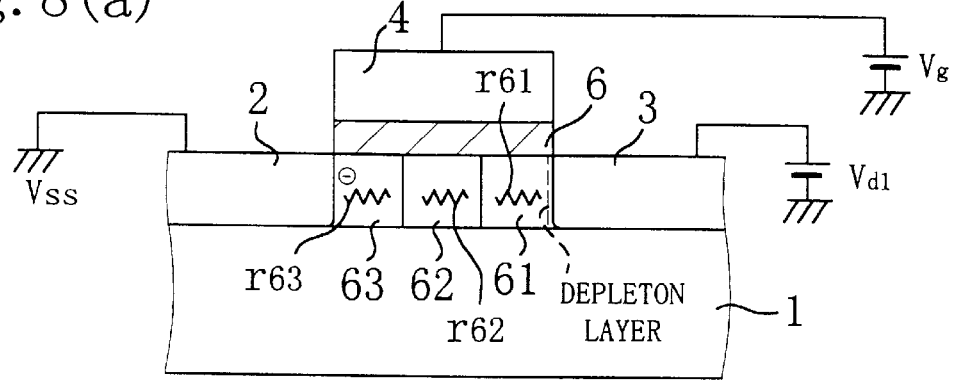
FIGS. 8(a) through 8(c) are sectional views for showing a method of driving the field effect transistor of the third embodiment.
Figure 8B:
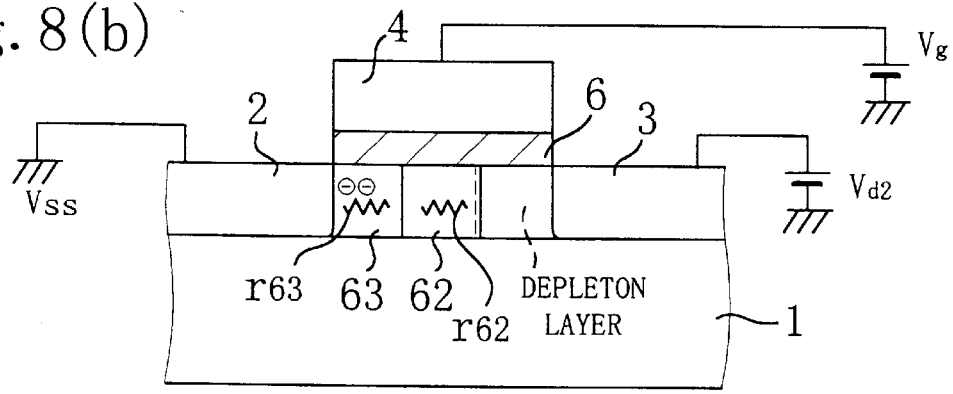
Figure 8C:
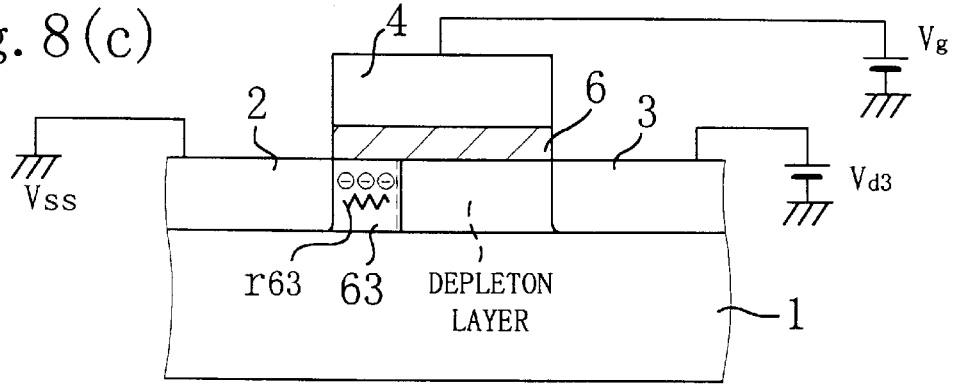

FIGS. 8(a) through 8(c) are sectional views for showing voltage applications for driving the field effect transistor of this embodiment.

FIG. 8(a) shows the section of the field effect transistor where a potential at the control gate electrode 4 is set at a voltage Vg (of, for example, approximately 3 V), a potential at the drain region 3 (drain electrode 102) is set at a voltage Vd1 (of, for example, approximately 1 V), and the source region 2 (source electrode 101) is grounded (0 V). Assuming that the first, second and third polysilicon layers 61, 62 and 63 have resistivities r61, r62 and r63, respectively, there is a relationship among the resistivities of r61>r62>r63 because the resistivity is smaller as the average size of crystalline grains in the polysilicon layer is larger. In this case, the potential at the control gate electrode 4 on the basis of the source region 2 is increased by the voltage Vg, and hence, an inversion layer is formed in the polysilicon layers 61 through 63 in the channel region 60 owing to the capacitance coupling with the control gate electrode 4. As a result, a channel current flows in the first through third polysilicon layers 61 through 63.

FIG. 8(b) shows the section of the field effect transistor where the potentials at the control gate electrode 4 and the source region 2 are set in the same manner as in FIG. 8(a) and the potential at the drain region 3 is increased to a voltage Vd2 (of, for example, approximately 2 V). As compared with the state shown in FIG. 8(a), the potential at the drain region 3 on the basis of the source region 2 is increased to the voltage Vd2, and hence, a depletion layer extends in the channel region 60 so as to cover the first polysilicon layer 61. Therefore, the inversion layer is formed in the second and third polysilicon layers 62 and 63 alone owing to the capacitance coupling with the control gate electrode 4. As a result, a channel current flows in the second and third polysilicon layers 62 and 63 alone.

FIG. 8(*c*) shows the section of the field effect transistor where the potentials at the control gate electrode 4 and the source region 2 are set in the same manner as in FIGS. 8(*a*) and 8(*b*) and the potential at the drain region 3 is increased to a voltage Vd3 (of, for example, approximately 3 V). In this case, as compared with the state shown in FIG. 8(*b*), the potential at the drain region 3 on the basis of the source region 2 is further increased to the voltage Vd3, and hence, the depletion layer extends in the channel region 60 so as to cover not only the first polysilicon layer 61 but also the second polysilicon layer 62. Therefore, the inversion layer is formed in the third polysilicon layer 63 alone owing to the capacitance coupling with the control gate electrode 4. As a result, a channel current flows in the third polysilicon layer 63 alone.

In this manner, with the potential at the control gate electrode 4 set at a positive predetermined voltage Vg and the source region 2 grounded (0 V), a voltage is selectively applied to the drain region 3. As a result, the selected polysilicon layer(s) alone in the channel region 60 is inverted, and the unselected polysilicon layer(s) is not inverted. Accordingly, when a channel current is allowed to flow in a specific polysilicon layer(s) among the first, second and third polysilicon layers 61, 62 and 63 respectively having different channel resistivities r61, r62 and r63, an increasing ratio of the channel current can be discontinuously changed in accordance with the voltage applied to the drain region 3.

Figure 9:
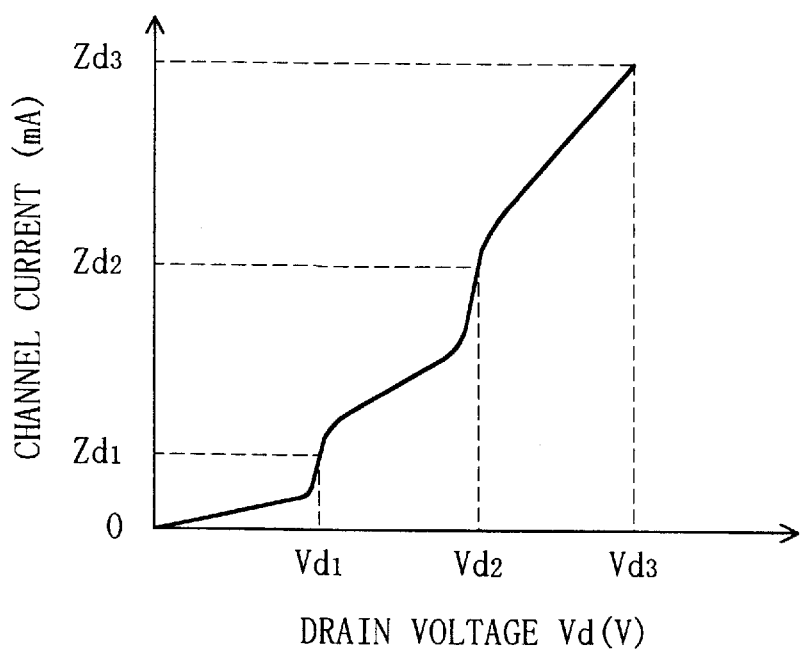
FIG. 9 is a diagram for showing a drain voltage-channel current characteristic of the field effect transistor of the third embodiment.

FIG. 9 is a diagram for showing variation of a channel current Zd (indicated by the ordinate) with a drain voltage Vd (indicated by the abscissa) changed as shown in FIGS. 8(*a*) through 8(*c*). As is shown in FIG. 9, the channel current Zd is increased in a stepwise manner at the drain voltage Vd1 at which the depletion layer reaches the interface between the first polysilicon layer 61 and the second polysilicon layer 62, and at the drain voltage Vd2 at which the depletion layer reaches the interface between the second polysilicon layer 62 and the third polysilicon layer 63.

Accordingly, since the field effect transistor of this embodiment is provided with the plural polysilicon layers 61 through 63 respectively including crystalline grains with different average sizes in the channel region 60, the variation characteristic of the channel current Zd against the change of the drain voltage Vd can be made different from that of an ordinary field effect transistor by using the difference in the channel resistivities r61 through r63 of the polysilicon layers 61 through 63. Specifically the field effect transistor of this embodiment is applicable to various fields as a so-called non-linear device.

In particular, when the average sizes of the crystalline grains are different in the plural polysilicon layers and the polysilicon layer closer to the drain region includes crystalline grains with a smaller average size as in this embodiment, the non-linearity of the voltage-current characteristic can be remarkably exhibited.

Various methods are applicable to the formation of the plural polysilicon layers respectively including crystalline grains with different average sizes. In particular, it is well known that an amorphous silicon film can be changed into a polysilicon film through an annealing after the formation thereof. Amorphous silicon has an irregular structure formed through rapid solidification, and is thermally unstable. Therefore, when an amorphous silicon film is annealed, a change to a more stable crystalline state is caused. This method can be adopted in a process carried out at a comparatively low temperature, and is a known technique for forming a polysilicon film on an inexpensive glass substrate. It is also well known that the size of crystalline grains in a formed polysilicon film can be variously adjusted by utilizing variation of the generation probability of a crystalline nucleus through variation of the annealing condition for the amorphous silicon film.

Accordingly, this technique is applicable to the formation of the plural polysilicon layers 61 through 63 including the crystalline grains with different average sizes as in this embodiment. Now, the other methods of forming the polysilicon layers applicable to this embodiment will be specifically described.

A. Method utilizing irradiation with an excimer laser beam:

After forming an amorphous silicon hydride film on a substrate of glass or the like by the CVD, hydrogen in the amorphous silicon film is released through an annealing at a temperature of 500° C. for approximately 3 hours. Then, while irradiating the amorphous silicon film with an excimer laser beam focused into a small diameter, the surface of the substrate is scanned with locally changing the intensity of the excimer laser beam. Thus, the first polysilicon layer 61 and the third polysilicon layer 63 with a larger width and the second polysilicon layer 62 with a smaller width (of approximately 75 nm) sandwiched therebetween are formed. In this manner, the field effect transistor with a fine structure having a gate length, i.e., a channel length, of approximately 0.25 $\mu$m can be easily manufactured. In this case, the highest intensity of the excimer laser beam is used for the formation of the first polysilicon layer 61, the lowest intensity is used for the formation of the third polysilicon layer 63, and an intermediate intensity is used for the formation of the second polysilicon layer 62. As a result, the above-described difference in the average size of the crystalline grains in the polysilicon layers 61 through 63 can be realized.

Instead of scanning with the excimer laser beam, the amorphous silicon film can be irradiated with parallel beams of the excimer laser by using a mask with a plurality of stripes respectively having different absorption coefficients against the excimer laser. Thus, the plural polysilicon layers including the crystalline grains with different average sizes can be similarly formed.

B. Lateral sealing method:

FIGS. 18(*a*) through 18(*d*) are sectional views for showing the formation of the polysilicon layers by a lateral sealing method.

First, in a procedure shown in FIG. 18(*a*), after forming a silicon nitride film 301 and an amorphous silicon hydride film on a glass substrate 300, the RTA is effected at a temperature of approximately 500° C. for approximately 3 hours so as to release hydrogen, thereby forming an amorphous silicon film. 302. A silicon nitride film 303 is deposited on the amorphous silicon film 302. The silicon nitride film 303 is made into a pattern, so that plural gaps can be formed in the silicon nitride film 303. Then, a nickel silicide film 304 is formed on the amorphous silicon film 302 exposed in the gaps of the silicon nitride film 303.

Next, in a procedure shown in FIG. 18(*b*), a pulsed rapid thermal annealing (PRTA) is effected at a temperature of several hundreds degrees centigrade for several seconds. Thus, crystallization of amorphous silicon is accelerated, so that the third polysilicon layer 63 including crystalline grains with a large average size can be formed directly below the nickel silicide film 304.

Figure 18A:
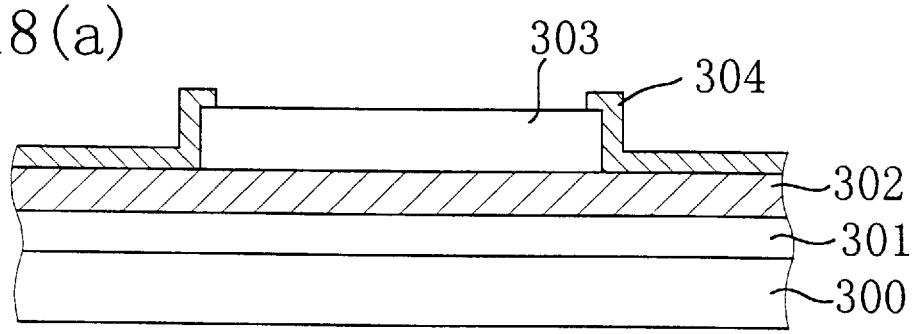
FIGS. 18(a) through 18(d) are sectional views for showing procedures of a lateral sealing method, adoptable in the third and other embodiments, for forming a plurality of polysilicon layers respectively including crystalline grains with different average sizes.
Figure 18B:
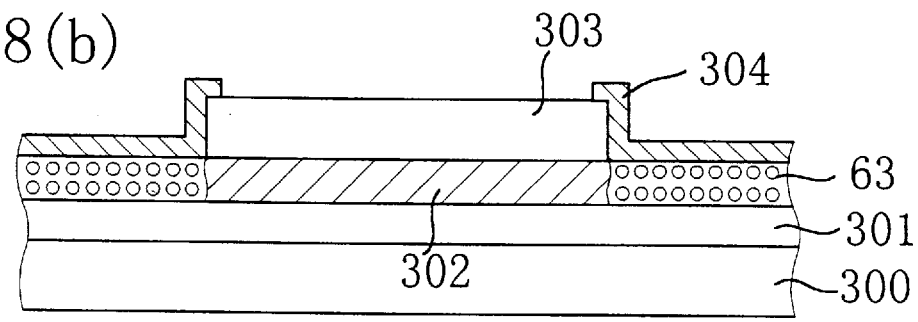
Figure 18C:
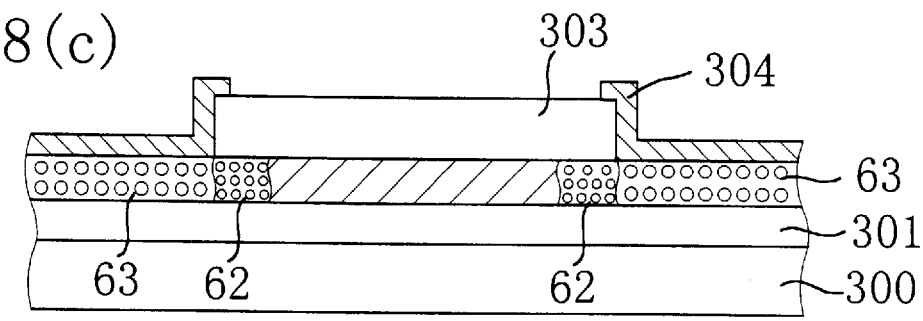

Then, in a procedure shown in FIG. 18(c), the PRTA is effected at a comparatively low temperature, so that the crystallization proceeds from the third polysilicon layer 63 in the lateral direction. As a result, the second polysilicon layer 62 including crystalline grains with a smaller average size than that in the third polysilicon layer 63 can be formed. Furthermore, by effecting the PRTA at a further lower temperature, the first polysilicon layer 61 including the crystalline grains with a smallest average size is formed adjacent to the second polysilicon layer 62.

Figure 18D:
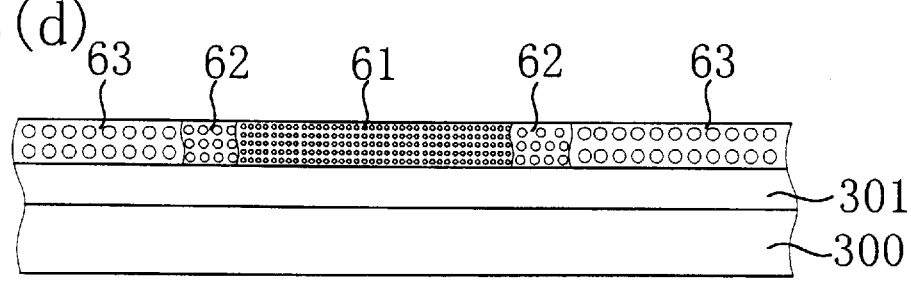

Ultimately, in a procedure shown in FIG. 18(d), the nickel silicide film 304 and the silicon nitride film 303 are removed. In this manner, the first through third polysilicon layers 61 through 63 including the crystalline grains with different average sizes can be formed.

Alternatively, the first polysilicon layer 61 including the crystalline grains with a smallest average size can be formed as follows: After attaining the state shown in FIG. 18(c), the nickel silicide film 304 and the silicon nitride film 303 are removed, and the entire surface is irradiated with an excimer laser beam or the like.

C. Ion beam method:

After forming an amorphous silicon film on a substrate, the amorphous silicon film is irradiated with a Si ion beam under condition of an implantation amount of $10^{15}$ cm$^{-2}$ and an energy of approximately 200 keV, thereby forming vacancy layers in the amorphous silicon layer. After embedding seeds of polysilicon in the vacancy layers, an annealing is effected at a temperature of several hundreds degrees centigrade for several seconds. Thus, a polysilicon layer including crystalline grains with a size in accordance with the size of the vacancy can be formed. In this case, by changing the irradiation condition for the Si ion beam, the size of the crystalline grains in the polysilicon layer can be adjusted.

(Embodiment 4)

A fourth embodiment of the invention will now be described with reference to FIGS. 10(a) through 10(d), 11(a) through 11(d) and 12.

Figure 10A:
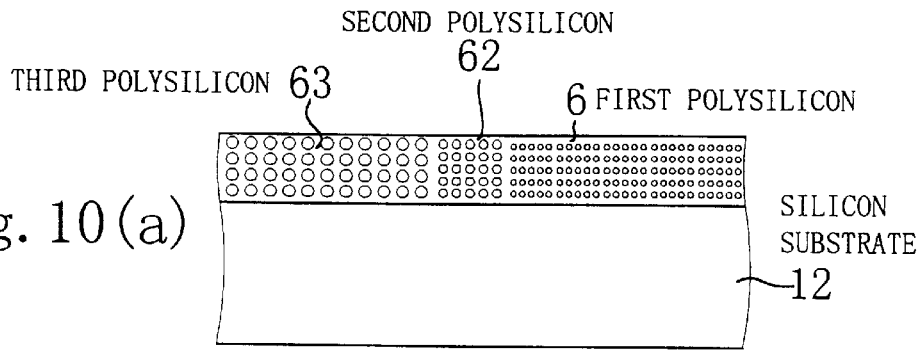
FIGS. 10(a) through 10(d) are sectional views for showing manufacturing procedures for a nonvolatile semiconductor storage device, according to a fourth embodiment of the invention, comprising a channel region formed out of a plurality of polysilicon layers respectively including crystalline grains with different average sizes.
Figure 10B:
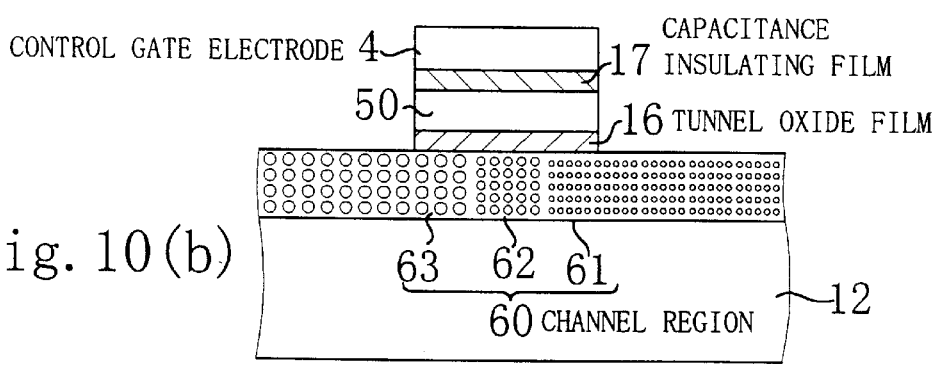
Figure 10C:
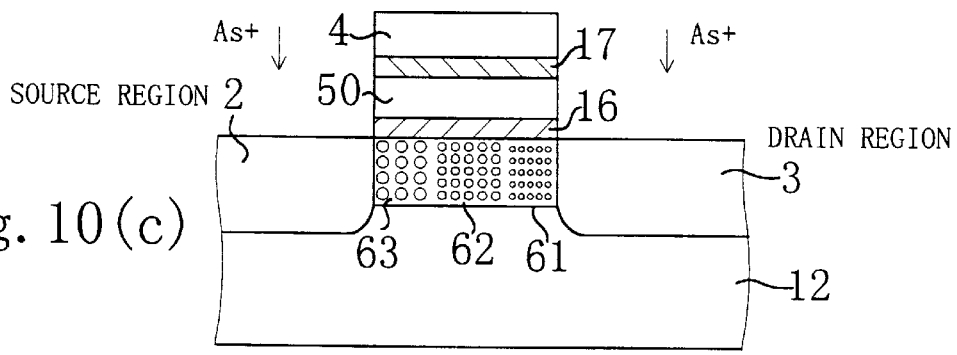
Figure 10D:
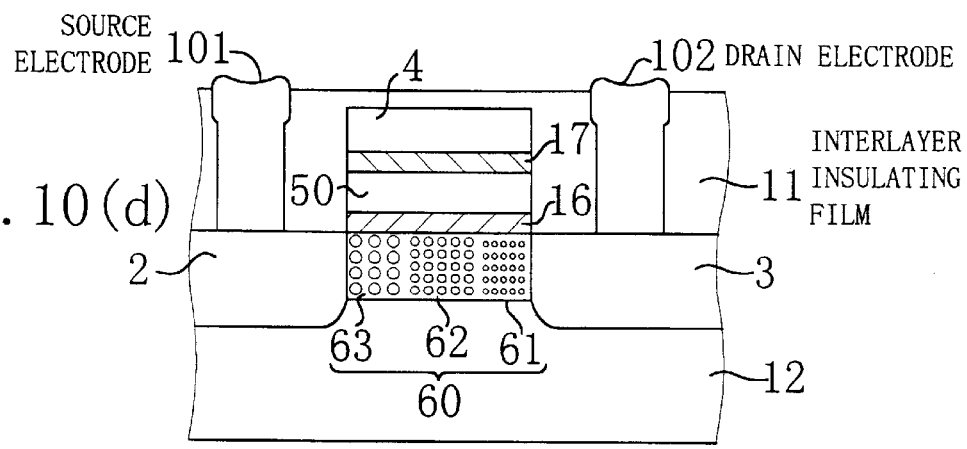

FIG. 10(d) is a sectional view for showing the structure of a polysilicon channel type nonvolatile semiconductor storage device manufactured by a method of this embodiment. The semiconductor storage device of this embodiment works as a multivalued memory applying the structure of the field effect transistor of the third embodiment. The following description will be given on a semiconductor storage device manufactured by a process using a design rule (minimum dimension) of 0.25 μm through 10 μm.

As is shown in FIG. 10(d), the semiconductor storage device of this embodiment comprises a channel region 60 including three polysilicon layers formed on a silicon substrate 12; a source region 2 and a drain region 3 formed in the silicon substrate 12 opposing each other with the channel region 60 sandwiched therebetween; a tunnel oxide film 16 of a silicon oxide film with a thickness of approximately 6 nm formed on the channel region 60; a floating gate electrode 50 of a single polysilicon layer formed on the tunnel oxide film 16; a capacitance insulating film 17 of an ON film with a thickness of approximately 15 nm including a silicon oxide film and a silicon nitride film formed on the floating gate electrode 50; a control gate electrode 4 of a polysilicon film, a polycide film, an aluminum film or a tantalum film formed on the capacitance insulating film 17; an interlayer insulating film 11 of a silicon oxide film deposited on the source region 2, the drain region 3 and the control gate electrode 4; and a source electrode 101 and a drain electrode 102 in contact with the source region 2 and the drain region 3, respectively formed by burying contact holes formed in the interlayer insulating film 11.

The control gate electrode 4 has a gate length (a length along a channel length) of 0.25 through 10 μm. The source region 2 and the drain region 3 are both doped with an n-type impurity at a concentration of approximately $10^{20}$ through $10^{21}$ cm$^{-3}$.

The channel region 60 includes a first polysilicon layer 61 formed adjacent to the drain region 3 and including crystalline grains with a smallest average size, a second polysilicon layer 62 formed adjacent to the first polysilicon layer 61 and including crystalline grains with a larger average size than that in the first polysilicon layer 61, and a third polysilicon layer 63 formed between the second polysilicon layer 62 and the source region 2 and including crystalline grains with a further larger average size than that in the second polysilicon layer 62. In other words, the polysilicon layer closer to the drain region 3 includes crystalline grains with a smaller average size. However, the positions of the first polysilicon layer 61 and the third polysilicon layer 63 can be reversed. Each of the polysilicon layers 61, 62 and 63 is doped with a p-type impurity at a concentration of approximately $10^{17}$ cm$^{-3}$.

Now, the manufacturing procedures for realizing the aforementioned structure of the semiconductor storage device will be described with reference to FIGS. 10(a) through 10(d).

First, in a procedure shown in FIG. 10(a), the first polysilicon layer 61 and the third polysilicon layer 63 with a larger width and the second polysilicon layer 62 with a smaller width sandwiched between the first and third polysilicon layers 61 and 63, in the same structure as that described in the third embodiment, are formed on the silicon substrate 12.

Next, in a procedure shown in FIG. 10(b), a silicon oxide film is formed on the polysilicon layers 61 through 63, and a polysilicon film for the floating gate is formed on the silicon oxide film by the CVD. A silicon oxide film with a thickness of approximately 7 nm and a silicon nitride film with a thickness of approximately 8 nm are successively formed as the ON film on the polysilicon film for the floating gate. A polysilicon film for the control gate with a thickness of approximately 200 nm is further formed on the ON film by the CVD. Then, photolithography and etching are carried out, thereby successively patterning the polysilicon film for the control gate, the ON film, the polysilicon film for the floating gate and the silicon oxide film. Thus, the control gate electrode 4 of the polysilicon film, the capacitance insulating film 17 of the ON film, the floating gate electrode 50 of the polysilicon film and the tunnel oxide film 16 of the silicon oxide film are formed on the polysilicon layers 61 through 63.

Then, in a procedure shown in FIG. 10(c), by using the control gate electrode 4 and the like as a mask, arsenic ions at a high concentration are introduced into areas in the first and third polysilicon layers 61 and 63 at both sides of the floating gate electrode 50, thereby forming the drain region 3 and the source region 2. In this manner, the channel region 60 including the three polysilicon layers 61 through 63 is formed below the control gate electrode 4, the capacitance insulating film 17, the floating gate electrode 50 and the tunnel oxide film 16.

Next, in a procedure shown in FIG. 10(d), the interlayer insulating film 11 of a silicon oxide film with a thickness of approximately 500 through 800 nm is deposited on the entire surface of the substrate, and the contact holes respectively reaching the source region 2 and the drain region 3 are formed in the interlayer insulating film 11. A metal film is further deposited within the contact holes and on the interlayer insulating film 11, and the metal film is made into a pattern, thereby forming the source electrode 101 and the drain electrode 102.

FIGS. 11(a) through 11(d) are sectional views for showing voltage applications for driving the semiconductor storage device of this embodiment.

Figure 11A:
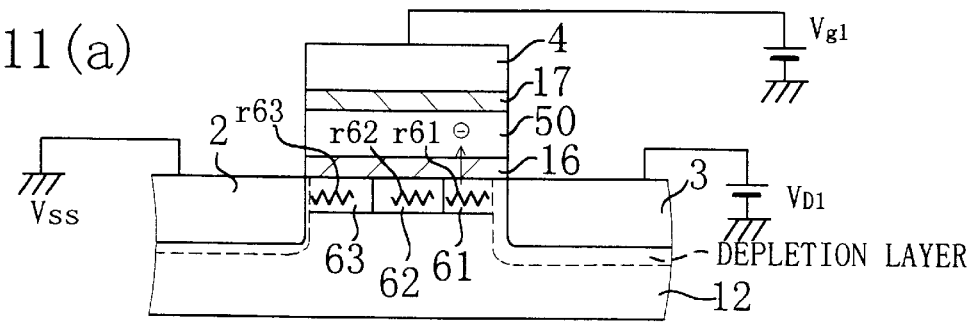
FIGS. 11(a) through 11(d) are sectional views for showing a method of driving the nonvolatile semiconductor storage device of the fourth embodiment.

FIG. 11(a) shows the section of the semiconductor storage device where a potential at the control gate electrode 4 is set at a voltage Vg1 (of, for example, approximately 3 V), a potential at the drain region 3 (drain electrode 102) is set at a voltage VD1 (of, for example, approximately 1 V) and the source region 2 (source electrode 101) is grounded (0 V). At this point, similarly to the third embodiment, assuming that the first, second and third polysilicon layers 61, 62 and 63 have resistivities r61, r62 and r63, respectively, there is a relationship among the resistivities of r61>r62>r63 because the resistivity is smaller as the average size of the crystalline grains in the polysilicon layer is larger. In this case, the potential at the gate electrode 4 on the basis of the source region 2 is increased by the voltage Vg1, and hence, the potential at the floating gate electrode 50 is also increased owing to the capacitance coupling with the control gate electrode 4. Furthermore, owing to the capacitance coupling with the floating gate electrode 50, an inversion layer is formed in the polysilicon layers 61 through 63 in the channel region 60, and a channel current flows in the first through third polysilicon layers 61 through 63, so that electrons can be injected from the first polysilicon layer 61 into the floating gate electrode 50.

Figure 11B:
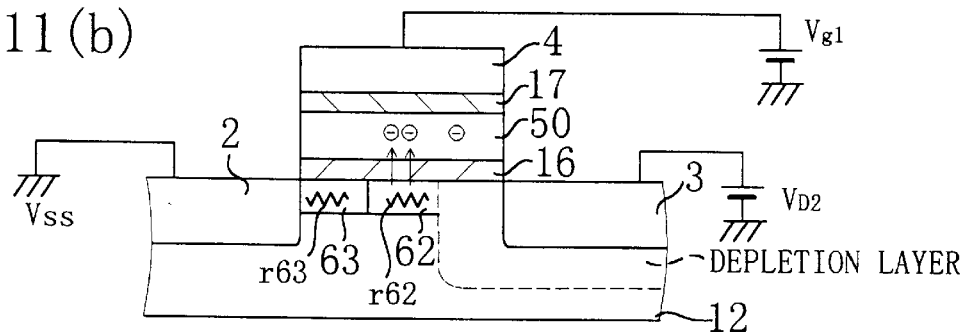

FIG. 11(b) shows the section of the semiconductor storage device where the potentials at the control gate electrode 4 and the source region 2 are set in the same manner as in FIG. 11(a) and the potential at the drain region 3 is increased to a voltage VD2 (of, for, example, approximately 2 V). In this case, as compared with the state shown in FIG. 11(a), the potential at the drain region 3 on the basis of the source region 2 is increased to the voltage VD2, and hence, a depletion layer extends in the channel region 60 so as to cover the first polysilicon layer 61. Then, owing to the capacitance coupling with the control gate electrode 4 through the floating gate electrode 50, the inversion layer is formed in the second and third polysilicon layers 62 and 63 alone. Accordingly, a channel current flows in the second and third polysilicon layers 62 and 63 alone, and electrons are injected into the floating gate electrode 50 from the second polysilicon layer 62.

Figure 11C:
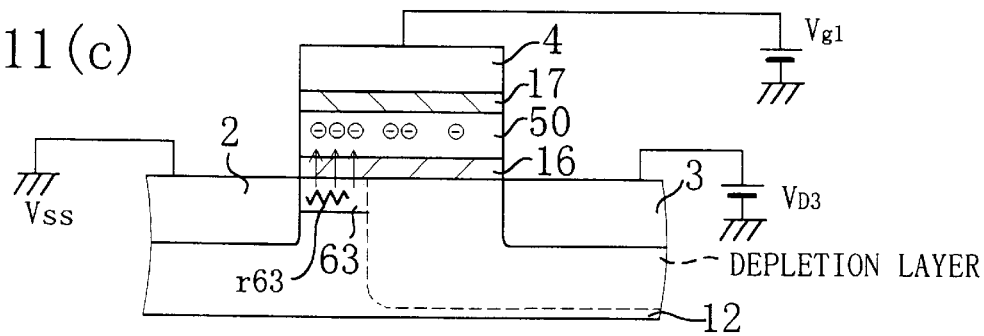

FIG. 11(c) shows the section of the semiconductor storage device where the potentials at the control gate electrode 4 and the source region 2 are set in the same manner as in FIGS. 11(a) and 11(b) and the potential at the drain region 3 is increased to a voltage VD3 (of, for example, approximately 3 V). In this case, as compared with the state shown in FIG. 11(b), the potential of the drain region 3 on the basis of the source region 2 is further increased to the voltage VD3, and hence, the depletion layer extends in the channel region 60 so as to cover not only the first polysilicon layer 61 but also the second polysilicon layer 62. Then, the inversion layer is formed in the third polysilicon layer 63 alone owing to the capacitance coupling with the control gate electrode 4 through the floating gate electrode 50. Accordingly, a channel current flows in the third polysilicon layer 63 alone, and electrons are injected into the floating gate electrode 50 from the third polysilicon layer 63.

Figure 11D:
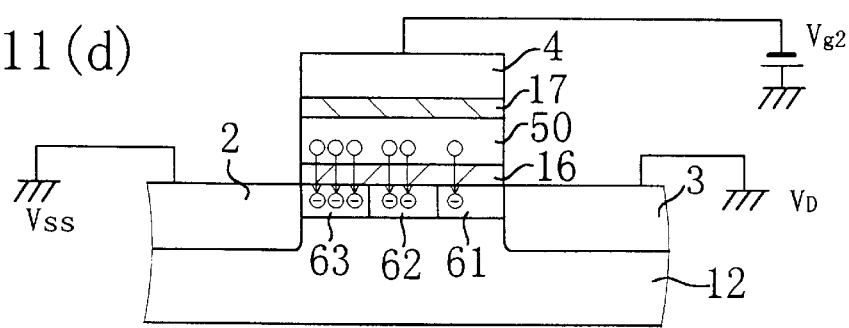

FIG. 11(d) shows the section of the semiconductor storage device where the potential at the control gate electrode 4 is set at a negative voltage Vg2 (of, for example, approximately −3 V) and the source region 2 and the drain region 3 are grounded (0 V). In this case, the potential at the control gate electrode 4 on the basis of the source region 2 and the drain region 3 is negative, and hence, the potential at the floating gate electrode 50 becomes negative owing to the capacitance coupling with the control gate electrode 4. As a result, electrons in the floating gate electrode 50 are extracted to the source region 2 and the drain region 3 through the polysilicon layers 61 through 63.

As is shown in FIGS. 11(a) through 11(c), by selectively applying a voltage to the drain region 3 with the potential at the control gate electrode 4 set at a positive predetermined voltage Vg and with the source region 2 grounded (0 V), the selected polysilicon layer(s) alone in the channel region 60 is inverted and the unselected polysilicon layer(s) is not inverted. Accordingly, a charge is injected into the floating gate electrode 50 through a specific polysilicon layer(s) among the first, second and third polysilicon layers 61, 62 and 63 respectively having the different channel resistivities r61, r62 and r63. As a result, a storage charge amount in the floating gate electrode 50 can be varied discontinuously in accordance with the voltage applied to the drain region 3.

Figure 12:
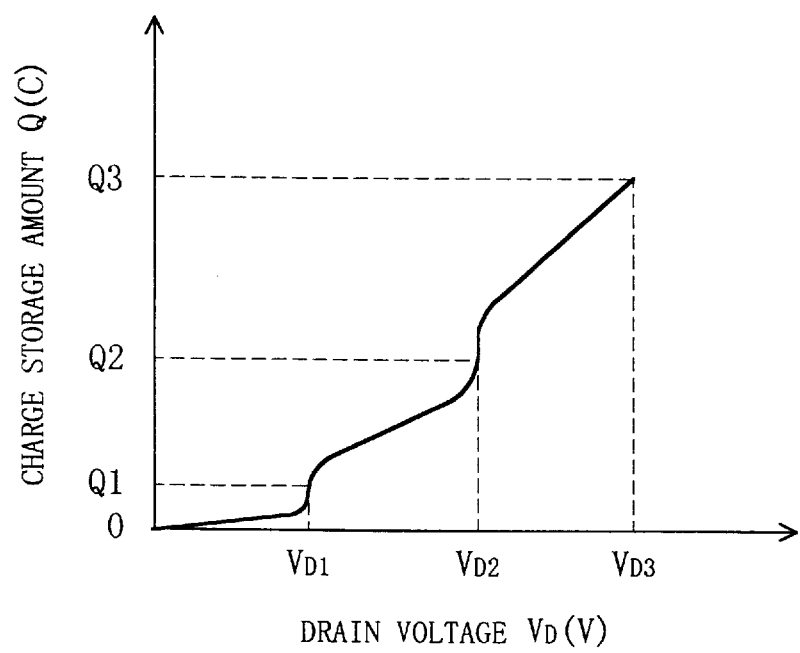
FIG. 12 is a diagram for showing a drain voltage-charge storage amount characteristic of the nonvolatile semiconductor storage device of the fourth embodiment.
Figure 14A:
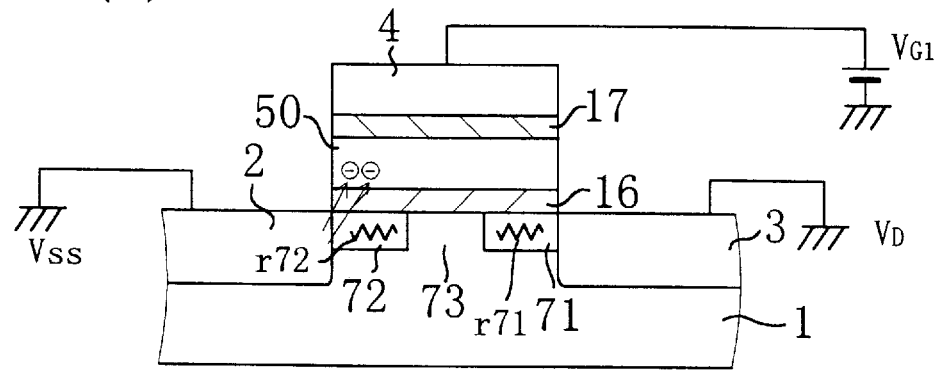
FIGS. 14(a) through 14(c) are sectional views for showing a method of driving the nonvolatile semiconductor storage device of the fifth embodiment.
Figure 14B:
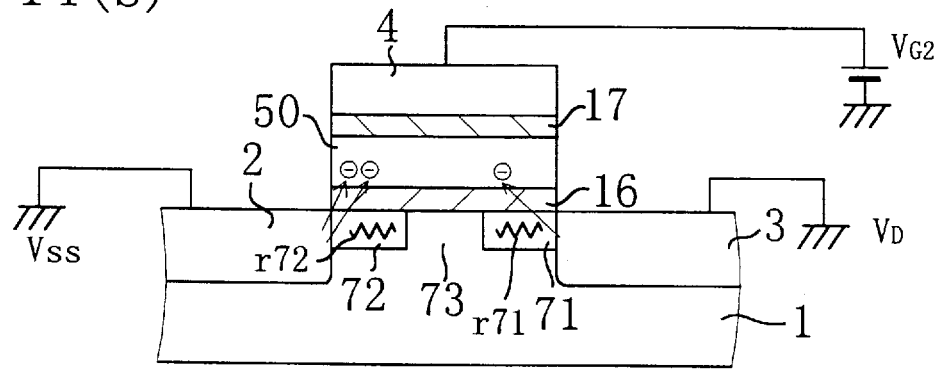
Figure 14C:
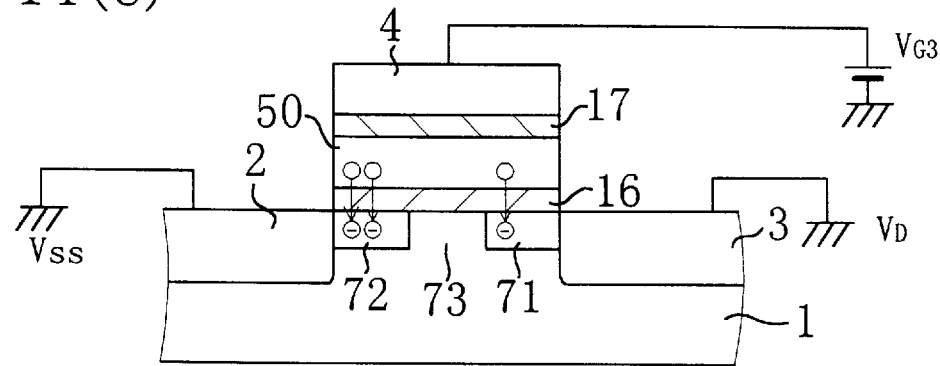

FIG. 12 is a diagram for showing variation of a storage charge amount Q (indicated by the ordinate) with a drain voltage Vd (indicated by the abscissa) changed as is shown in FIGS. 11(a) through 11(c). As is shown in FIG. 12, the storage charge amount Q is increased in a stepwise manner at the drain voltage VD1 at which the depletion layer reaches the interface between the first polysilicon layer 61 and the second polysilicon layer 62 and at the drain voltage VD2 at which the depletion layer reaches the interface between the second polysilicon layer 62 and the third polysilicon layer 63.

In this manner, since the semiconductor storage device of this embodiment is provided with the plural polysilicon layers 61 through 63 respectively including the crystalline grains with different average sizes in the channel region 60, the variation characteristic of the storage charge amount Q in the floating gate electrode 50 against the variation of the drain voltage Vd (i.e., the Vd-Id characteristic) can be changed by utilizing the difference in the channel resistivities r61 through r63 of the respective polysilicon layers 61 through 63. Thus, the semiconductor storage device can be used as the so-called multivalued memory.

In particular, when the average sizes of the crystalline grains in the plural polysilicon layers are different and the polysilicon layer closer to the drain region includes the crystalline grains with the smaller average size as in this embodiment, a difference in the storage charge amount among respective memory values of the multivalued memory can be remarkably exhibited.

(Embodiment 5)

A fifth embodiment of the invention will now be described with reference to FIGS. 13(a) through 13(d), 14(a) through 14(c) and 15.

FIG. 13(d) is a sectional view for showing the structure of a polysilicon channel type nonvolatile semiconductor storage device manufactured by a method of this embodiment. The semiconductor storage device of this embodiment is a multivalued memory obtained by replacing the second polysilicon layer 62 of the fourth embodiment with a monocrystalline silicon layer. The following description will be given on a semiconductor storage device manufactured by a process using a design rule (minimum dimension) of 0.25 μm through 10 μm.

As is shown in FIG. 13(d), the semiconductor storage device of this embodiment comprises a channel region 70 including two polysilicon layers and one monocrystalline silicon layer formed on a silicon substrate 12; a source region 2 and a drain region 3 formed in the silicon substrate 12 so as to oppose each other with the channel region 70 sandwiched therebetween; a tunnel oxide film 16 of a silicon oxide film with a thickness of approximately 6 nm formed on the channel region 70; a floating gate electrode 50 of a single polysilicon layer formed on the tunnel oxide film 16; a capacitance insulating film 17 of an ON film with a thickness of approximately 15 nm including a silicon oxide film and a silicon nitride film formed on the floating gate electrode 50; a control gate electrode 4 of a polysilicon film, a polycide film, an aluminum film or a tantalum film formed on the capacitance insulating film 17; an interlayer insulating film 11 of a silicon oxide film deposited on the source region 2, the drain region 3 and the control gate electrode 4; and a source electrode 101 and a drain electrode 102 in contact with the source region 2 and the drain region 3, respectively formed by burying contact holes formed in the interlayer insulating film 11.

The control gate electrode 4 has a gate length (length along a channel length) of 0.25 through 10 $\mu$m. The source region 2 and the drain region 3 are both doped with an n-type impurity at a concentration of $10^{20}$ through $10^{21}$ cm$^{-3}$.

The channel region 70 includes a first polysilicon layer 71 formed adjacent to the drain region 3 and including crystalline grains with a small average size, a second polysilicon layer 72 formed adjacent to the source region 2 and including crystalline grains with an average size larger than that in the first polysilicon layer 71, and a monocrystalline silicon layer 73 formed between the first polysilicon layer 71 and the second polysilicon layer 72. In other words, among the pair of polysilicon layers 71 and 72 opposing each other with the monocrystalline silicon layer 73 sandwiched therebetween, one closer to the drain region 3 includes crystalline grains with a smaller average size. Each of the layers 71, 72 and 73 is doped with a p-type impurity at a concentration of approximately $10^{17}$ cm$^{-3}$.

Now, the manufacturing procedures for realizing the aforementioned structure of the semiconductor storage device will be described with reference to FIGS. 13(*a*) through 13(*d*).

First, in a procedure shown in FIG. 13(*a*), a large number of grooves 76 each with a larger width are formed on the surface of the silicon substrate 12, and the monocrystalline silicon layer 73 is formed so as to partition the grooves 76. Then, an amorphous silicon film 75 is deposited on the entire surface of the substrate.

Next, in a procedure shown in FIG. 13(*b*), after flattening the entire surface of the substrate, the amorphous silicon film 75 buried in each groove 76 is changed into the first polysilicon layer 71 including the crystalline grains with the smaller average size and the second polysilicon layer 72 including the crystalline grains with the larger average size by adopting any of the aforementioned methods such as the annealing through the irradiation with an excimer laser beam and the lateral sealing. In this embodiment, the first polysilicon layer 71 is formed in a drain forming area and the second polysilicon layer 72 is formed in a source forming area in each of the grooves 76. However, the positions of the first polysilicon layer 71 and the second polysilicon layer 72 can be reversed.

Then, in a procedure shown in FIG. 13(*c*), a silicon oxide film is formed on the polysilicon layers 71 and 72 and the monocrystalline silicon layer 73, a polysilicon film for the floating gate is further formed on the silicon oxide film by the CVD, and the ON film is formed by successively forming a silicon oxide film with a thickness of approximately 7 nm and a silicon nitride film with a thickness of approximately 8 nm on the polysilicon film for the floating gate. A polysilicon film for the control gate with a thickness of approximately 200 nm is further formed on the ON film by the CVD. Then, photolithography and etching are carried out, thereby successively patterning the polysilicon film for the control gate, the ON film, the polysilicon film for the floating gate and the silicon oxide film. Thus, the control gate electrode 4 of the polysilicon film, the capacitance insulating film 17 of the ON film, the floating gate electrode 50 of the polysilicon film and the tunnel oxide film 16 of the silicon oxide film are formed on the silicon substrate 12. Then, by using the control gate electrode 4 and the like as a mask, arsenic ions at a high concentration are introduced into the control gate electrode 4 and areas in the first and second polysilicon layers 71 and 72 at both sides of the floating gate electrode 50, thereby forming the source region 2 and the drain region 3. In this manner, the channel region 70 including the pair of polysilicon layers 71 and 72 and the monocrystalline silicon layer 73 therebetween is formed below the control gate electrode 4, the capacitance insulating film 17, the floating gate electrode 50 and the tunnel oxide film 16.

Then, in a procedure shown in FIG. 13(*d*), the interlayer insulating film 11 of a silicon oxide film with a thickness of approximately 500 through 800 nm is deposited on the entire surface of the substrate, and the contact holes respectively reaching the source region 2 and the drain region 3 are formed in the interlayer insulating film 11. A metal film is deposited within the contact holes and on the interlayer insulating film 11, and the metal film is made into a pattern, thereby forming the source electrode 101 and the drain electrode 102.

FIGS. 14(*a*) through 14(*c*) are sectional views for showing voltage applications for driving the semiconductor storage device of this embodiment.

FIG. 14(*a*) shows the section of the semiconductor storage device where a potential at the control gate electrode 4 is set at a voltage VG1 (of, for example, approximately 1 V) and the drain region 3 (drain electrode 102) and the source region 2 (source electrode 101) are grounded (0 V). Assuming that the first and second polysilicon layers 71 and 72 have resistivities r71 and r72, respectively, there is a relationship among the resistivities of r71>r72 because the resistivity is smaller as the average size of the crystalline grains in the polysilicon layer is larger. In this case, the potential at the control gate electrode 4 on the basis of the source region 2 is increased by the voltage VG1, and hence the second polysilicon layer 72 with the lower resistivity in the channel region 70 is inverted owing to the capacitance coupling with the control gate electrode 4 through the floating gate electrode 50. Therefore, electrons are injected from the source region 2 into the floating gate electrode 50 through the second polysilicon layer 72.

FIG. 14(*b*) shows the section of the semiconductor storage device where the source region 2 and the drain region 3 remain to be grounded and the potential at the control gate electrode 4 is increased to a voltage VG2 (of, for example, approximately 2 V). In this case, as compared with the state shown in FIG. 14(*a*), the potential at the control gate electrode on the basis of the source region 2 and the drain region 3 is increased to the voltage VG2, and hence, the first polysilicon layer 71 is also inverted owing to the capacitance coupling with the control gate electrode 4 through the floating gate electrode 50. Accordingly, a larger number of electrons are injected from both the source region 2 and the drain region 3 through the first and second polysilicon layers 71 and 72 into the floating gate electrode 50.

FIG. 14(*c*) shows the section of the semiconductor storage device where the source region 2 and the drain region 3 remain to be grounded and the potential at the control gate electrode 4 is set at a negative potential VG3 (of, for example, approximately −3 V). In this case, the potential at the control gate electrode 4 on the basis of the source region 2 and the drain region 3 is negative, and hence, the potential at the floating gate electrode 50 becomes negative owing to the capacitance coupling with the control gate electrode 4. Accordingly, electrons in the floating gate electrode 50 are extracted through the first and second polysilicon layers 71 and 72 into the source region 2 and the drain region 3.

As is shown in FIGS. 14(*a*) and 14(*b*), by selectively applying a voltage to the control gate electrode 4 with the source region 2 and the drain region 3 grounded (0 V), the selected polysilicon layer(s) alone in the channel region 70 is inverted and the unselected polysilicon layer is not inverted. Accordingly, a charge is injected into the floating gate electrode 50 through a specific polysilicon layer(s) among the first and second polysilicon layers 71 and 72 having the different resistivities r71 and r72. As a result, a storage charge amount in the floating gate electrode 50 can be discontinuously varied in accordance with the voltage applied to the drain region 3.

Figure 15:
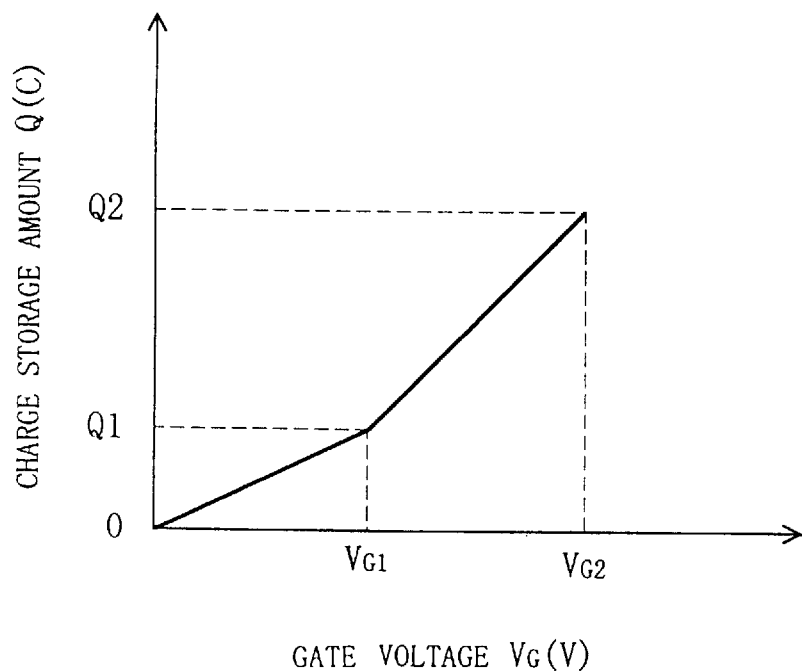
FIG. 15 is a diagram for showing a control gate voltage-charge storage amount characteristic of the nonvolatile semiconductor storage device of the fifth embodiment.

FIG. 15 is a diagram for showing variation of a storage charge amount Q (indicated by the ordinate) with a control gate voltage VG (indicated by the abscissa) changed as shown in FIGS. 14(*a*) and 14(*b*). As is shown in FIG. 15, the storage charge amount Q is increased in a stepwise manner at the gate voltage VG1 at which the electrons are injected into the floating gate electrode 50 also from the drain region 3.

In this manner, since the semiconductor storage device of this embodiment is provided with the pair of polysilicon layers 71 and 72 including the crystalline grains with different average sizes and the monocrystalline silicon layer 73 sandwiched therebetween in the channel region 70, the variation characteristic of the storage charge amount Q in the floating gate electrode 50 against the variation of the control gate voltage VG can be changed by utilizing the difference in the resistivities r71 and r72 of the polysilicon layers 71 and 72. Thus, the semiconductor storage device of this embodiment can be used as the so-called multivalued memory.

It is noted that the monocrystalline silicon layer 73 can be replaced with a polysilicon layer with a high resistivity.

(Embodiment 6)

A sixth embodiment of the invention will now be described with reference to FIGS. 16(*a*) and 16(*b*), which are perspective views for showing part of manufacturing procedures for a field effect transistor according to this embodiment.

Figure 16A:
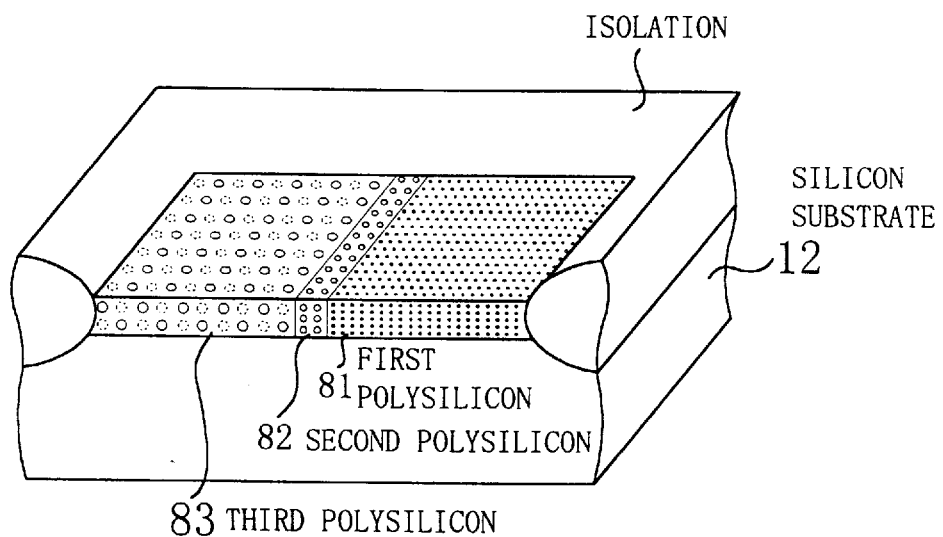
FIGS. 16(a) and 16(b) are sectional views for showing manufacturing procedures for a field effect transistor, according to a sixth embodiment of the invention, including a channel region formed out of a vacancy-introduced polysilicon layer sandwiched between two polysilicon layers respectively including crystalline grains with different average sizes.
Figure 16B:
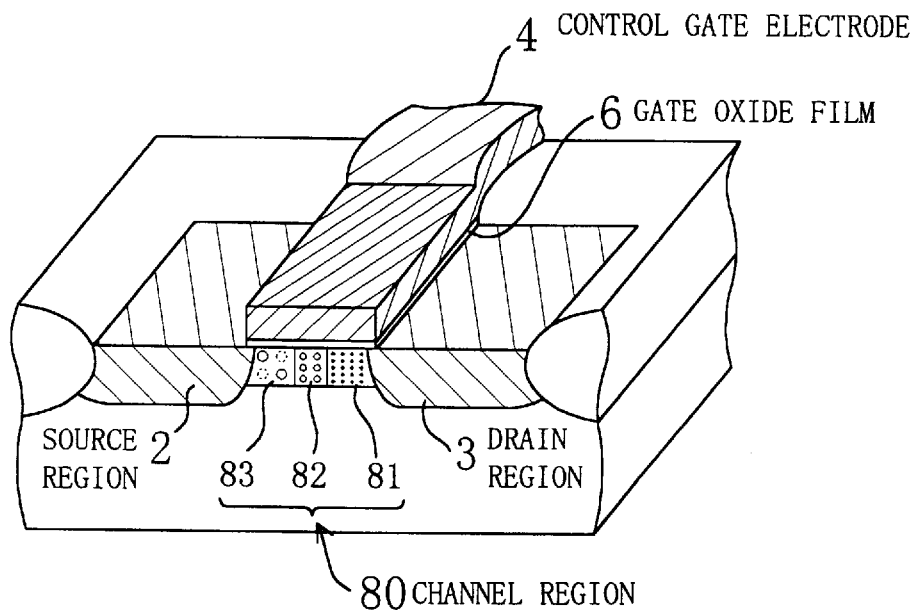

First, in a procedure shown in FIG. 16(*a*), on a silicon substrate 12, a first polysilicon layer 81 with a larger width including crystalline grains with a small average size and a second polysilicon layer 82 with a smaller width including crystalline grains with an average size larger than that in the first polysilicon layer 81, which are similar to the corresponding polysilicon layers described in the third embodiment, and a third polysilicon layer 83 of vacancy-introduced polysilicon, which is similar to the polysilicon layer described in the first embodiment, are formed. These polysilicon layers 81 through 83 can be easily formed, for example, as follows: The first and second polysilicon layers 81 and 82 including the crystalline grains with different sizes are formed by any of the methods described in the third embodiment. Then, vacancies are introduced into a larger part of the polysilicon layer 82 by any of the methods described in the first embodiment. However, the second and third polysilicon layers 82 and 83 can include crystalline grains with different average sizes.

Next, in a procedure shown in FIG. 16(*b*), a silicon oxide film and a polysilicon film for a control gate are successively formed on the substrate, and these films are successively patterned, thereby forming a gate oxide film 6 and a control gate electrode 4 on an area extending over the first through third polysilicon layers 81 through 83. As a result, a channel region 80 including the first through third polysilicon layers 81 through 83 are formed below the control gate electrode 4.

Also in this embodiment, the first polysilicon layer 81 has a largest channel resistivity and the third polysilicon layer 83 has a smallest channel resistivity. Therefore, the same effects as those of the third embodiment can be attained.

However, in stead of the third polysilicon layer 83, either the first polysilicon layer 81 or the second polysilicon layer 82 can be of a vacancy-introduced polysilicon layer.

Furthermore, when one of the first through third polysilicon layers 61 through 63 of the fourth embodiment is replaced with a vacancy-introduced polysilicon layer, the same effects as those of the fourth embodiment can be more remarkably exhibited.

Also, when one of the first and second polysilicon layers 71 and 72 of the fifth embodiment is replaced with a vacancy-introduced polysilicon layer, the same effects as those of the fifth embodiment can be more remarkably exhibited.

(Embodiment 7)

A seventh embodiment of the invention will now be described with reference to FIGS. 17(*a*) and 17(*b*), which are perspective views for showing merely part of manufacturing procedures for a field effect transistor of this embodiment.

Figure 17A:
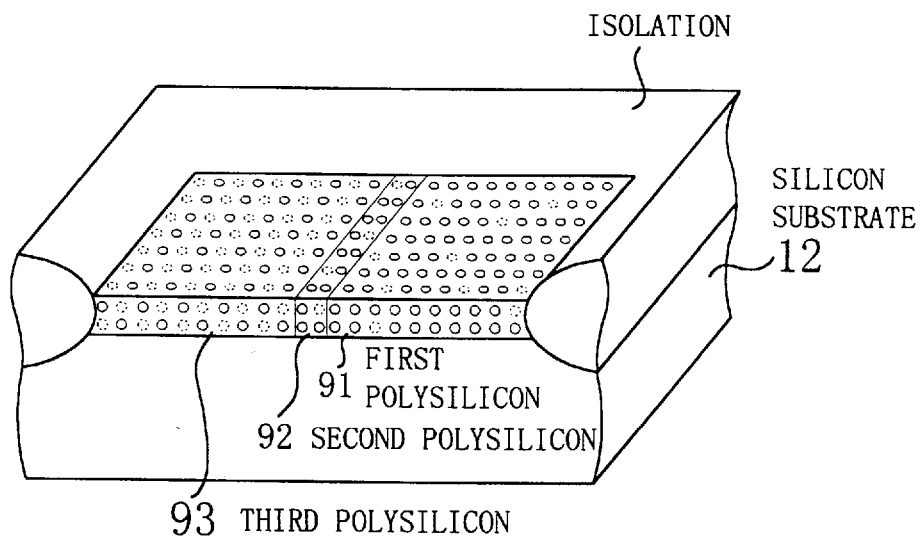
FIGS. 17(a) and 17(b) are sectional views for showing manufacturing procedures for a field effect transistor, according to a seventh embodiment of the invention, including a channel region formed out of three polysilicon layers respectively including vacancies in different numbers per unit volume.
Figure 17B:
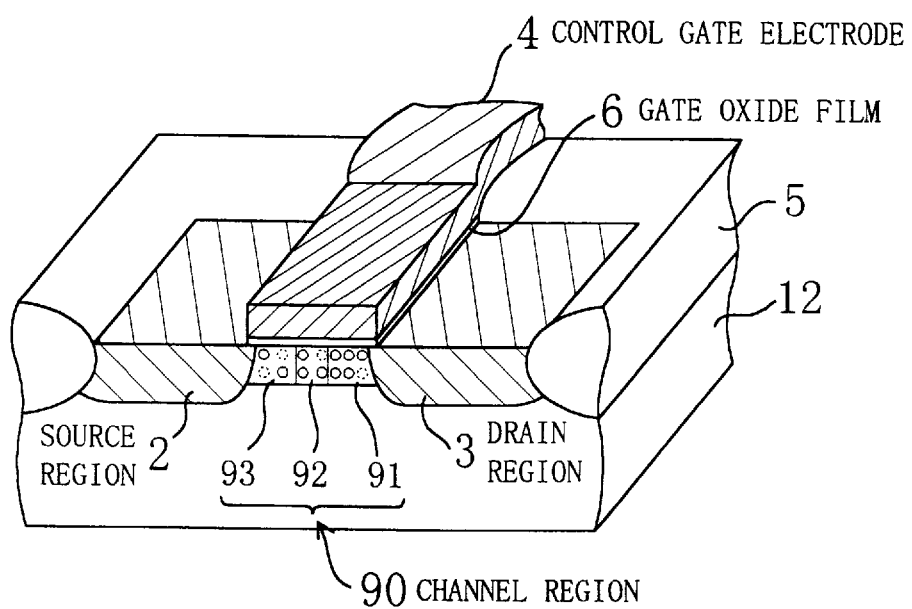

First, in a procedure shown in FIG. 17(*a*), on a silicon substrate 12, a first polysilicon layer 91 of vacancy-introduced polysilicon with a larger width, a second polysilicon layer 92 with a smaller width including a larger number of vacancies per unit volume than in the first polysilicon layer 91, and a third polysilicon layer 93 including a still larger number of vacancies per unit volume than in the second polysilicon layer 92, which are similar to the corresponding polysilicon layers described in the first embodiment, are formed. These polysilicon layers 91 through 93 can be easily formed, for example, by changing an implantation amount of hydrogen ions in the respective layers in carrying out the hydrogen ion beam irradiation described in the first embodiment. However, the polysilicon layers 91 through 93 can include crystalline grains with different average sizes.

Next, in a procedure shown in FIG. 17(*b*), a silicon oxide film and a polysilicon film for a control gate are successively formed on the substrate, and these films are successively patterned, thereby forming a gate oxide film 6 and a control gate electrode 4 on an area extending over the first through third polysilicon layers 91 through 93. As a result, a channel region 90 including the first through third polysilicon layers 91 through 93 is formed below the control gate electrode 4.

Also in this embodiment, the first polysilicon layer 91 has a largest channel resistivity and the third polysilicon layer 93 has a smallest channel resistivity. Therefore, the same effects as those of the third embodiment can be attained.

Furthermore, when the first through third polysilicon layers 61 through 63 of the fourth embodiment are replaced with polysilicon layers including vacancies in different numbers per unit volume, the same effects as those of the fourth embodiment can be more remarkably exhibited.

Also, when the first and second polysilicon layers 71 and 72 of the fifth embodiment are replaced with polysilicon layers including vacancies in different numbers per unit volume, the same effects as those of the fifth embodiment can be more remarkably exhibited.

(Embodiment 8)

A multivalued memory circuit according to an eighth embodiment will now be described.

Figure 19:
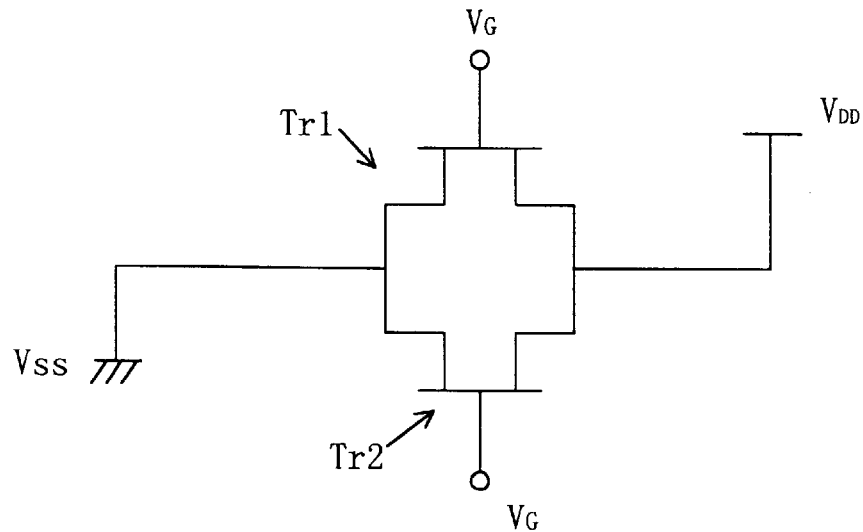
FIG. 19 is a circuit diagram of a multivalued memory circuit according to an eighth embodiment of the invention.

FIG. 19 is a circuit diagram for schematically showing the configuration of the multivalued memory circuit of this embodiment. As is shown in FIG. 19, a first transistor Tr1 and a second transistor Tr2, both of which have the structure as described in the first embodiment, are disposed in parallel between a power supply and a ground. These transistors Tr1 and Tr2 have channel regions including vacancies in different numbers per unit volume, and this difference leads to different Vd-Id characteristics of these transistors.

Figure 20:
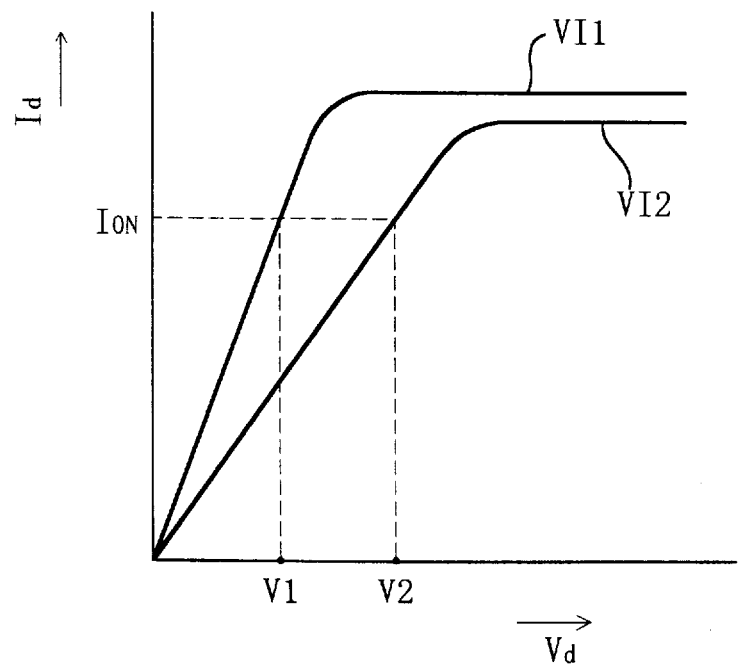
FIG. 20 is a diagram for showing Vd-Id characteristics of two field effect transistors used in the circuit of the eighth embodiment.
Figure 21:
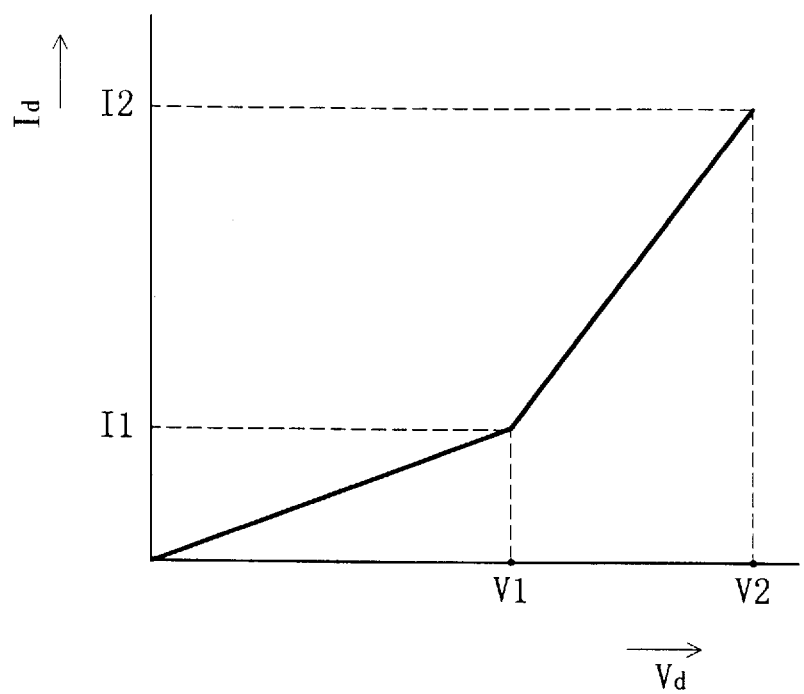
FIG. 21 is a diagram for showing a Vd-Id characteristic of the entire multivalued memory circuit of the eighth embodiment.
Figure 22:
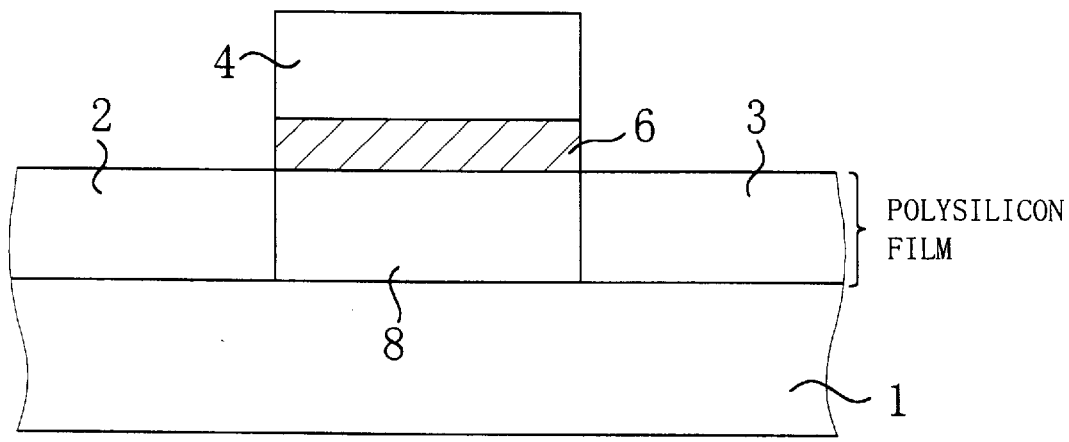
FIG. 22 is a sectional view for showing the general structure of a conventional field effect transistor.
Figure 23:
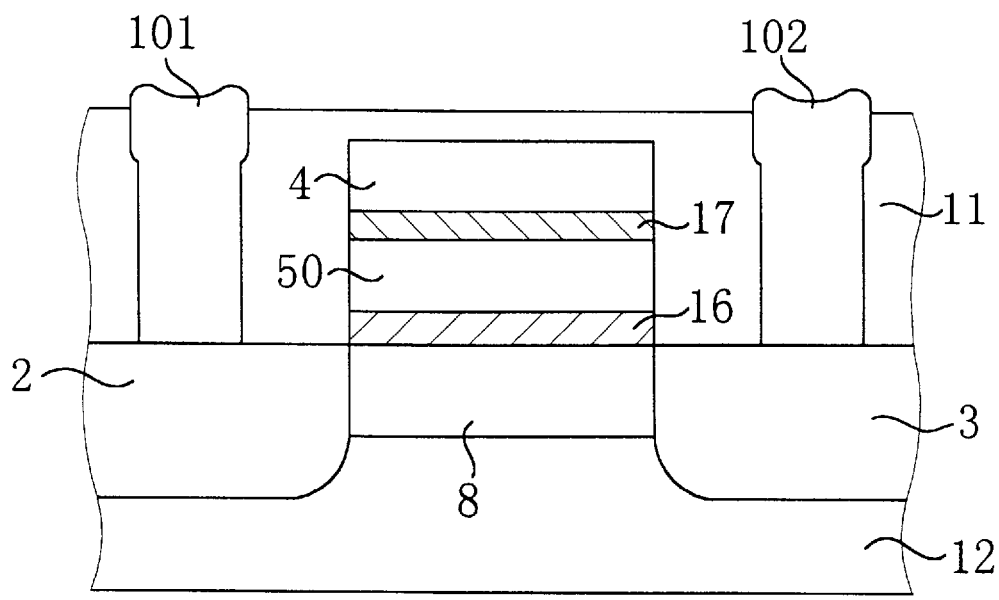
FIG. 23 is a sectional view for showing the general structure of a conventional nonvolatile semiconductor storage device.

FIG. 20 is a diagram for showing the current-voltage characteristics of the first and second transistors Tr1 and Tr2, wherein a curve VI1 indicates the Vd-Id characteristic of the first transistor Tr1 and a curve VI2 indicates the Vd-Id characteristic of the second transistor Tr2. As is shown in FIG. 20, when a drain voltage VDD is increased to a first voltage V1, an on-current ION flows through the first transistor Tr1 alone, and when the drain voltage VDD is increased to a second voltage V2, the on-current ION flows through both the first and second transistors Tr1 and Tr2. Accordingly, the entire circuit has a Vd-Id characteristic as is shown in FIG. 21. Therefore, this circuit including the two transistors Tr1 and Tr2 whose channel resistivities are largely different from each other can be used as the multivalued memory.

(Other embodiments)

In the first embodiment, the second polysilicon layer 42 with the vacancies introduced is sandwiched between the first and third polysilicon layers 41 and 43, but the invention is not limited to this structure. For example, any of the following structures is adoptable: A structure excluding either the first polysilicon layer 41 or the third polysilicon layer 43, namely, a structure in which not a polysilicon layer but a semiconductor region, an insulating substrate or the like is disposed directly below the vacancy-introduced polysilicon layer; a structure in which the vacancy-introduced polysilicon layer is disposed directly below the gate oxide film 6; and a structure in which the channel region 40 includes vacancy-introduced polysilicon layers alone.

Also, in the second embodiment, any of the following structures is adoptable: A structure in which the floating gate electrode includes merely two polysilicon layers, one with vacancies introduced and another without vacancies introduced; and a structure in which the floating gate electrode includes vacancy-introduced polysilicon layers alone.

Furthermore, in the respective embodiments describing the field effect transistors, polysilicon can be deposited either on an insulating substrate or on a silicon substrate. Furthermore, in the first, third, fourth, sixth and seventh embodiments, the channel region can be formed by forming a groove in the silicon substrate and filling the groove with a polysilicon layer.

In the respective embodiments describing the nonvolatile semiconductor storage device, the control gate electrode 4 is always formed above the floating gate electrode 50 and has the same flat shape as the floating gate electrode 50, but the invention is not limited to this structure. Specifically, any control gate electrode is applicable as far as it is capable of capacitance coupling with the floating gate electrode 50 through the capacitance insulating film 17. For example, the control gate electrode can be formed over the upper face and side faces of the floating gate electrode 50.

What is claimed is:

1. A field effect transistor comprising:
    a substrate;
    a channel region formed on said substrate and including a vacancy-introduced polysilicon layer;
    a gate insulating film formed on said channel region;
    a gate electrode formed on said gate insulating film; and
    a pair of source/drain regions sandwiching said channel region.

2. The field effect transistor of claim 1,
    wherein said channel region includes a polysilicon layer without vacancies introduced formed on said vacancy-introduced polysilicon layer.

3. The field effect transistor of any of claims 1 and 2,
    wherein said substrate is of an insulating material, and
    said source/drain regions are formed out of a polysilicon film deposited on said substrate.

4. The field effect transistor of any of claims 1 and 2, wherein said substrate comprises a semiconductor material, and said source/drain regions extend into said substrate and contact the polysilicon layer formed on said substrate.

5. The field effect transistor of claim 1, wherein said channel region includes a polysilicon layer without vacancies introduced formed below said vacancy-introduced polysilicon layer.

6. A field effect transistor comprising:
    a substrate;
    source and drain regions each formed of a semiconductor material, said source and drain regions being provided in respective parts on said substrate which are present at a distance from each other;
    a channel region including a plurality of polysilicon layers, which are disposed between said source and drain regions on said substrate in series along a direction of a flow of a channel current and have different resistivities from one another, said plurality of polysilicon layers being disposed in order of resistivity such that one of said polysilicon layers located closer to said drain region has a higher resistivity;
    a gate insulating film formed on said channel region; and
    a gate electrode formed on said gate insulating film, said gate electrode facing said plurality of polysilicon layers.

7. The field effect transistor of claim 6,
    wherein the resistivities of said polysilicon layers are adjusted to be different from one another by using a difference in an average size of crystalline grains among said polysilicon layers.

8. The field effect transistor of claim 7,
    wherein among said polysilicon layers, one closer to said drain region includes crystalline grains with a smaller average size.

9. The field effect transistor of claim 6,
    wherein each of said polysilicon layers is formed out of a vacancy-introduced polysilicon layer, and the resistivities of said polysilicon layers are adjusted to be different from one another by using a difference in a number of vacancies per unit volume among said polysilicon layers.

10. The field effect transistor of claim 9, wherein among said polysilicon layers, one closer to said drain region includes a smaller number of vacancies per unit volume.

11. The field effect transistor of claim 6, wherein the resistivities of said polysilicon layers are adjusted to be different from one another by allowing a polysilicon layer with vacancies introduced and a polysilicon layer without vacancies introduced to be included in said polysilicon layers.

12. The field effect transistor of claim 6, wherein said substrate is of an insulating material, and said source/drain regions are formed out of a polysilicon film deposited on said substrate.

13. The field effect transistor of claim 6, wherein said substrate comprises a semiconductor material, and said source/drain regions extend into said substrate and contact the polysilicon layers disposed on said substrate.

14. A semiconductor storage device comprising:

a substrate having a semiconductor area;

a channel region formed in a part of said semiconductor area;

a tunnel insulating film formed on said channel region and allowing a charge to pass therethrough by tunneling;

a floating gate electrode formed on said tunnel insulating film and including a vacancy-introduced polysilicon layer;

a capacitance insulating film formed in contact with at least a part of said floating gate electrode;

a control gate electrode formed to be capable of capacitance coupling with said floating gate electrode through said capacitance insulating film; and a pair of source/drain regions formed in said semiconductor area and sandwiching said channel region.

15. The semiconductor storage device of claim 14, wherein said floating gate electrode further includes a polysilicon layer without vacancies introduced on said vacancy-introduced layer.

16. The semiconductor storage device of claim 14, wherein said floating gate electrode further includes a polysilicon layer without vacancies introduced below said vacancy introduced layer.

17. A semiconductor storage device comprising:

a substrate having a semiconductor area;

source and drain regions each formed of a semiconductor material, said source and drain regions being provided in respective parts on said substrate which are present at a distance from each other;

a channel region including a plurality of polysilicon layers, which are disposed between said source and drain regions on said substrate in series along a direction of a flow of a channel current and have different resistivities from one another, said plurality of polysilicon layers being disposed in order of resistivity such that one of said polysilicon layers located closer to said drain region has a higher resistivity;

a tunnel insulating film formed on said channel region and allowing a charge to pass therethrough by tunneling;

a floating gate electrode formed on said tunnel insulating film, said floating gate electrode facing said polysilicon layers;

a capacitance insulating film formed in contact with at least a part of said floating gate electrode; and a control gate electrode formed to be capable of capacitance coupling with said floating gate electrode through said capacitance insulating film.

18. The semiconductor storage device of claim 17, wherein said channel region includes two polysilicon layers having different resistivities from each other and a monocrystalline silicon layer between said polysilicon layers.

19. The semiconductor storage device of claim 17, wherein the resistivities of said polysilicon layers are adjusted to be different from one another by using a difference in an average size of crystalline grains among said polysilicon layers.

20. The semiconductor storage device of claim 19, wherein among said polysilicon layers, one closer to said drain region includes crystalline grains with a smaller average size.

21. The semiconductor storage device of claim 15, wherein each of said polysilicon layers is formed out of a vacancy-introduced polysilicon layer, and the resistivities of said polysilicon layers are adjusted to be different from one another by using a difference in a number of vacancies per unit volume among said polysilicon layers.

22. The semiconductor storage device of claim 19, wherein among said polysilicon layers, one closer to said drain region includes a smaller number of vacancies per unit volume.

23. The semiconductor storage device of claim 15, wherein the resistivities of said polysilicon layers are adjusted to be different from one another by allowing a polysilicon layer with vacancies introduced and a polysilicon layer without vacancies introduced to be included in said polysilicon layers.

* * * * *

UNITED STATES PATENT AND TRADEMARK OFFICE
CERTIFICATE OF CORRECTION

PATENT NO.   : 5,847,411
DATED        : December 8, 1998
INVENTOR(S)  : Tomoyuki Morii It is certified that error appears in the above-identified patent and that said Letters Patent is hereby corrected as shown below:

<u>In the Drawings,</u>
Sheet 7 of 21, Fig. 7(c), extend the lead line from reference numeral "4" to the region immediately above the layer identified with reference numeral "6" as shown below:

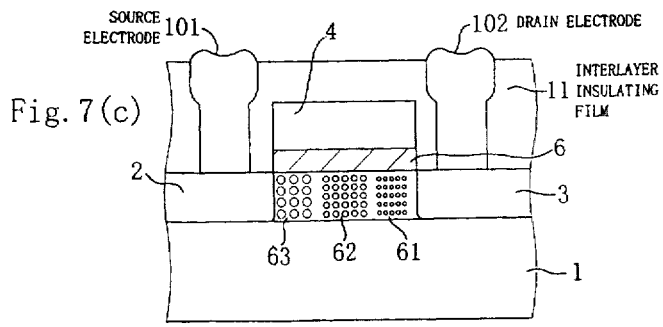

Sheet 10 of 21, Fig 10(a), change the reference numeral "6" referring to the "FIRST POLYSILICON" to reference numeral -- 61 --, as shown below:

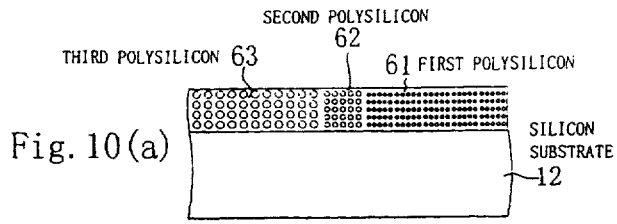

Signed and Sealed this

Thirtieth Day of October, 2001

Attest:

NICHOLAS P. GODICI
*Attesting Officer*    Acting Director of the United States Patent and Trademark Office